US012701671B2

(12) United States Patent
Bandhauer et al.

(10) Patent No.: US 12,701,671 B2
(45) Date of Patent: Aug. 4, 2026

(54) JET IMPINGEMENT COOLING DEVICES, SYSTEMS, AND METHODS

(71) Applicant: Colorado State University Research Foundation, Fort Collins, CO (US)

(72) Inventors: Todd M. Bandhauer, Fort Collins, CO (US); David R. Hobby, Wellington, CO (US); Zachary H. Gilvey, Fort Collins, CO (US)

(73) Assignee: Colorado State University Research Foundation, Fort Collins, CO (US)

( * ) Notice: Subject to any disclaimer, the term of this patent is extended or adjusted under 35 U.S.C. 154(b) by 640 days.

(21) Appl. No.: 17/759,799

(22) PCT Filed: Jan. 28, 2021

(86) PCT No.: PCT/US2021/015521
§ 371 (c)(1),
(2) Date: Jul. 29, 2022

(87) PCT Pub. No.: WO2021/155018
PCT Pub. Date: Aug. 5, 2021

(65) Prior Publication Data
US 2023/0063534 A1 Mar. 2, 2023

Related U.S. Application Data

(60) Provisional application No. 62/967,837, filed on Jan. 30, 2020.

(51) Int. Cl.
*H05K 7/20* (2006.01)
*H10W 40/77* (2026.01)

(52) U.S. Cl.
CPC ..... *H05K 7/20145* (2013.01); *H05K 7/20736* (2013.01); *H10W 40/776* (2026.01)

(58) Field of Classification Search
CPC ............ H05K 7/20145; H05K 7/20736; H01L 23/4336; H01L 23/4735
See application file for complete search history.

(56) References Cited

U.S. PATENT DOCUMENTS 5,316,075 A    5/1994  Quon et al.
5,388,635 A *  2/1995  Gruber ...................... F28F 3/12
                                              257/E23.09

(Continued)

OTHER PUBLICATIONS

International Search Report and Written Opinion, PCT/US2021/015521, dated Apr. 12, 2021.

*Primary Examiner* — Tho V Duong
(74) *Attorney, Agent, or Firm* — Robinson IP Law, PLLC

(57) ABSTRACT

An impingement cooling device including a distributor plate, a manifold, and a heat spreader. The distributor plate includes a first side, a second side opposite the first side, a plurality of injection ports extending through the distributor plate from the first side to the second side, and a plurality of extraction ports extending through the distributor plate from the first side to the second side. The manifold is coupled to the distributor plate and includes a partition wall separating the plurality of injection ports and the plurality of extraction ports on the first side. The heat spreader at least partially covers an object to be cooled and includes a top surface configured to oppose the second side of the distributor plate. The heat spreader further includes a surface feature on the top surface configured to increase heat transfer therefrom.

12 Claims, 35 Drawing Sheets

(56) References Cited

U.S. PATENT DOCUMENTS

| | | | | |
|---|---|---|---|---|
| 5,987,892 A * | 11/1999 | Watanabe | ............ | A47G 29/141 |
| | | | | 62/434 |
| 6,366,462 B1 * | 4/2002 | Chu | .................... | H01L 23/427 |
| | | | | 257/714 |
| 7,040,381 B2 * | 5/2006 | Eisele | .................... | F28F 3/086 |
| | | | | 361/689 |
| 7,866,173 B2 * | 1/2011 | Brunschwiler | ......... | G06F 1/206 |
| | | | | 361/699 |
| 8,210,243 B2 * | 7/2012 | Bezama | ................ | H01L 23/473 |
| | | | | 165/80.4 |
| 8,464,781 B2 * | 6/2013 | Kenny | .................... | F28F 13/06 |
| | | | | 165/80.4 |
| 9,502,330 B1 * | 11/2016 | Gupta | .................... | H01L 23/473 |
| 10,533,809 B1 * | 1/2020 | Sherrer | .............. | H01L 23/4735 |
| 2007/0119565 A1 * | 5/2007 | Brunschwiler | ..... | H01L 23/4735 |
| | | | | 165/80.2 |
| 2011/0048689 A1 | 3/2011 | Johnson | | |
| 2014/0204534 A1 | 7/2014 | Choudhury et al. | | |
| 2014/0347817 A1 * | 11/2014 | Joshi | ................ | H05K 7/20927 |
| | | | | 361/699 |
| 2016/0293518 A1 | 10/2016 | Gohara et al. | | |
| 2017/0115039 A1 | 4/2017 | St. Rock et al. | | |
| 2017/0250123 A1 | 8/2017 | Bandhauer et al. | | |
| 2018/0090417 A1 * | 3/2018 | Gutala | ............... | H01L 21/4882 |
| 2018/0204784 A1 | 7/2018 | Kawase et al. | | |
| 2020/0227341 A1 * | 7/2020 | Neal | ......................... | F28F 3/12 |

* cited by examiner

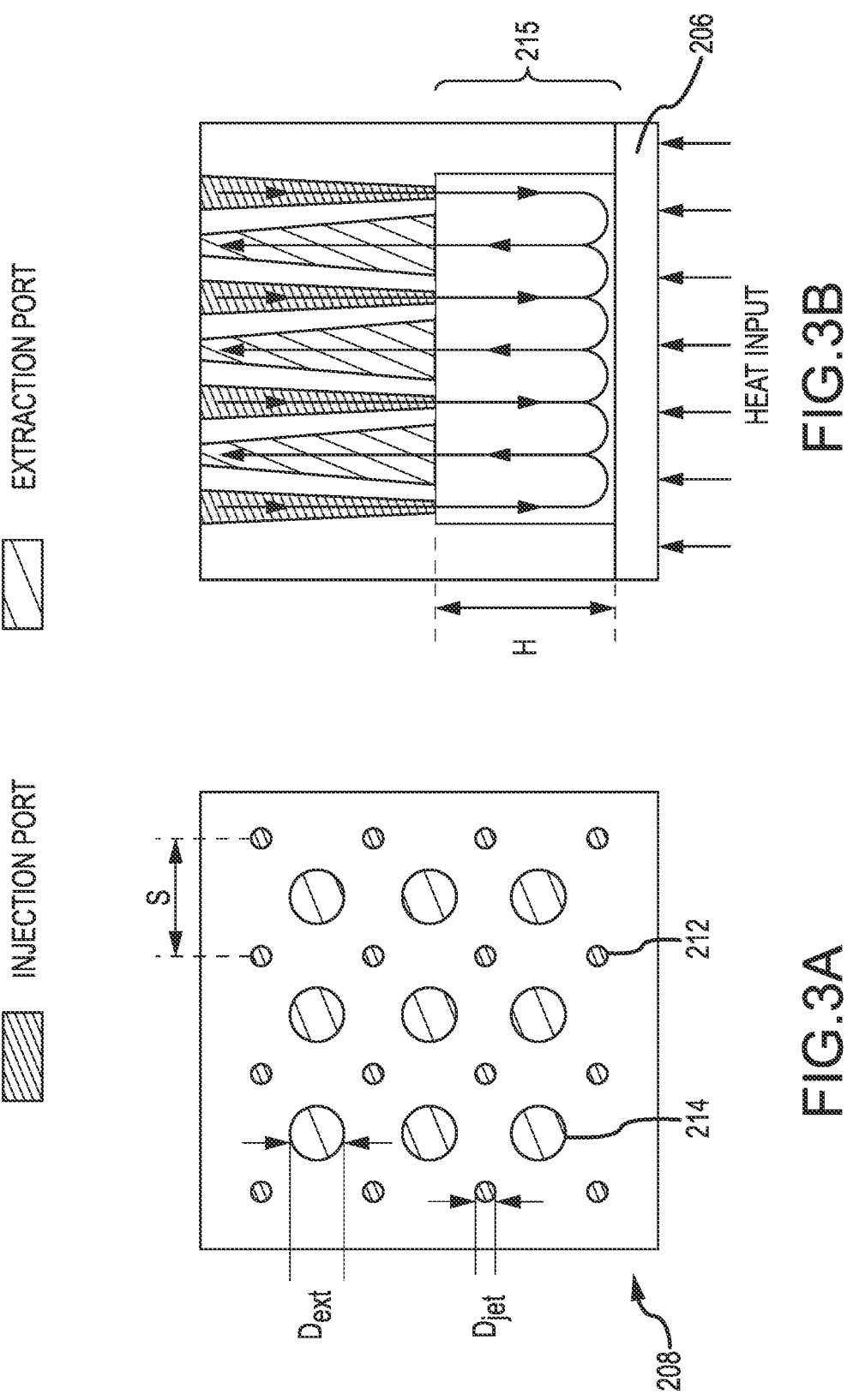

1556s

1502

1508

1558

1558

1556s

JET IMPINGEMENT COOLING DEVICES, SYSTEMS, AND METHODS

CROSS-REFERENCE TO RELATED APPLICATIONS

This application claims the benefit of U.S. Provisional Application No. 62/967,837, filed Jan. 30, 2020, which is hereby incorporated by reference in its entirety.

TECHNICAL FIELD

The subject matter herein generally relates to jet impingement cooling devices, systems, and methods. More specifically, the subject matter herein relates to jet impingement cooling devices, systems, and methods for cooling electronic components on a printed circuit board.

BACKGROUND

Electrical components such as integrated circuits (IC), for example, heat up when in use. Exceeding a critical temperature can lead to decreased efficiencies and failures of the components and/or connections of the IC. A conventional solution is shown in FIG. 1A, which is a cross-sectional side view of a heat sink 100 coupled to a lid 102 that is positioned over an IC 104 on a printed circuit board (PCB) 106. The heat associated with the IC 104 is mitigated with heat sink 100 and, in certain instances, a fan (not shown). The heat sink 100 may include a series of metal fins 108 coupled to a metal plate 110 that is in contact with the lid 102 through a heat sink compound or thermal interface material (TIM) 112. Another layer of TIM 112 may be utilized between the bottom surface of the lid 102 and the top surface of the IC 104. In this way, the heat from the IC 104 transfers through the TIM 112 to the lid 102, which then is spread out to the metal plate 110 through the TIM 112, and then to the metal fins 108. As indicated by the arrow in FIG. 1A, the primary thermal path PTP is away from the IC 104 and towards the heat sink 100, while the secondary thermal path STP is through the PCB 106. In the example of FIG. 1A, cool air 114 flows through and dissipates the heat from the metal fins 108 of the heat sink 100. The exiting air 116 is heated as a result of the cooling of the metal fins 108. The heat dissipation process can be enhanced with a fan.

Another conventional heat dissipation IC is shown in FIG. 1B, which is a cross-sectional side view of a jet impingement plate 120 and an IC 104. As seen in the figure, the impingement plate 120 is attached to a top surface of the IC 104. The impingement plate 120 includes openings 122 that permit a cooling fluid (e.g., air, water, gas) to pass through. The cooling fluid passes over and cools the IC 104, and then flows out openings 124 in the impingement plate 120. The heat is transferred from the IC 104 to the cooling fluid, and out of the impingement plate 120.

With continued power increases in devices such as ICs, application-specific integrated circuits (ASIC), and field-programmable gate arrays (FPGA), among other devices, improvements in cooling technology are needed without adding to the space constraints of the devices. It is with these thoughts in mind, among others, that aspects of the jet impingement cooling devices, systems, and methods were developed.

SUMMARY

Aspects of the present disclosure include an impingement cooling device including a distributor plate, a manifold, and a heat spreader. The distributor plate includes a first side, a second side opposite the first side, a plurality of injection ports extending through the distributor plate from the first side to the second side, and a plurality of extraction ports extending through the distributor plate from the first side to the second side. The manifold is coupled to the distributor plate and includes a partition wall separating the plurality of injection ports and the plurality of extraction ports on the first side. The heat spreader at least partially covers an object to be cooled and includes a top surface configured to oppose the second side of the distributor plate. The heat spreader further includes a surface feature on the top surface configured to increase heat transfer therefrom.

Aspects of the present disclosure may include an impingement cooling device for providing cooling fluid to an object. The impingement cooling device may include a distributor plate, a manifold, and an impingement target. The distributor plate may include a first side, a second side opposite the first side, a plurality of injection ports extending through the distributor plate from the first side to the second side, and a plurality of extraction ports extending through the distributor plate from the first side to the second side. The manifold may be coupled to the distributor plate and include an inflow volume, an outflow volume, a first inflow opening in fluid communication with the inflow volume and the plurality of injection ports of the distributor plate, a first outflow opening in fluid communication with the outflow volume and the plurality of extraction ports of the distributor plate, and at least one structure separating the inflow volume and the outflow volume on the first side of the distributor plate. The impingement target may include a top surface, a bottom surface opposite the top surface, and a plurality of surface features protruding from the top surface, impingement target may be coupled to the distributor plate such that the second side of the distributor plate opposes the top surface of the impingement target, wherein the impingement target may be coupled to a heat spreader covering the object so as to provide cooling to the object.

In certain instances, the device further may include a thermal interface material on the bottom side of the impingement target for facilitating heat transfer between the impingement target and the heat spreader.

In certain instances, the plurality of surface features on the top surface of the impingement target may include surface etchings or machined features.

In certain instances, the plurality of surface features are offset from the plurality of injection ports and the plurality of extraction ports on the second side of the distributor plate when the top surface of the impingement target opposes the second side of the distributor plate.

In certain instances, each of the plurality of injection ports are formed within a post that protrudes from the second side of the distributor plate.

In certain instances, when the impingement target is coupled to the distributor plate, the posts of the distributor plate and the surface features protruding from the top surface of the impingement target intersect a plane between the impingement target and the distributor plate. In certain instances, wherein the plane is parallel to the top surface of the impingement target.

In certain instances, the manifold may include a second inflow opening in fluid communication with the inflow volume and the plurality of injection ports of the distributor plate, and a second outflow opening in fluid communication with the outflow volume and the plurality of extraction ports of the distributor plate.

In certain instances, the device further may include one or more cover plates secured to the manifold to restrict fluid flow through at least one of the first inflow opening, the second inflow opening, the first outflow opening, and the second outflow opening.

In certain instances, at least one structure of the manifold includes planar wall sections defining a trapezoidal cross-section.

In certain instances, the device further may include a thermal interface material bonding the manifold and the distributor plate together. In certain instances, the plurality of injection ports are non-linear nozzles.

Aspects of the present disclosure may include method of providing cooling fluid to an object covered by a heat spreader. The method may include coupling a bottom surface of an impingement target of an impingement cooling device to the heat spreader. The impingement cooling device may include a distributor plate, a manifold, and the impingement target, the distributor plate including a first side, a second side opposite the first side, a plurality of injection ports extending through the distributor plate from the first side to the second side, and a plurality of extraction ports extending through the distributor plate from the first side to the second side. The manifold may be coupled to the distributor plate and include a first inflow opening in fluid communication with the plurality of injection ports of the distributor plate, a first outflow opening in fluid communication with the plurality of extraction ports of the distributor plate, and at least one structure providing a fluid barrier that separates the first inflow opening and the plurality of injection ports on the first side of the distributor plate from the first outflow opening and the plurality of extraction ports on the first side of the distributor plate. The impingement target may include a top surface, the bottom surface opposite the top surface, and a plurality of surface features protruding from the top surface, impingement target coupled to the distributor plate such that the second side of the distributor plate opposes the top surface of the impingement target. The method may further include providing a first flow of fluid through the first inflow opening of the manifold, the first flow of fluid providing cooling to the heat spreader covering the object.

In certain instances, the bottom surface of the impingement target of the impingement cooling device is coupled to the heat spreader via a thermal interface material. In certain instances, the bottom surface of the impingement target has a first surface area, and a top surface of the heat spreader has a second surface area, the first surface area being larger than the second surface area. In certain instances, the bottom surface of the impingement target overhangs at least one side of the heat spreader.

In certain instances, each of the plurality of injection ports are defined in posts that extend downward from the first side of the distributor plate, the posts of the distributor plate and the surface features protruding from the top surface of the impingement target intersect a plane between the impingement target and the distributor plate.

In certain instances, the manifold may include a second inflow opening in fluid communication with the plurality of injection ports of the distributor plate, and a second outflow opening in fluid communication with the plurality of extraction ports of the distributor plate, the method may include: providing a second flow of fluid through the second inflow opening of the manifold, the second flow of fluid providing cooling to the heat spreader covering the object.

In certain instances, the manifold may include a second inflow opening in fluid communication with the plurality of injection ports of the distributor plate, and a second outflow opening in fluid communication with the plurality of extraction ports of the distributor plate. The method may include: blocking one or more of the second inflow opening, the first outflow opening, and the second outflow opening.

In certain instances, the method may include attaching an inflow header to the first inflow opening, and an outflow header to the first outflow opening.

Aspects of the present disclosure may include an impingement cooling device for providing cooling fluid to an object on a board. The impingement cooling device may include a first distributor plate, a first manifold, and a heat spreader. The first distributor plate includes a first side, a second side opposite the first side, a plurality of injection ports extending through the first distributor plate from the first side to the second side, and a plurality of extraction ports extending through the first distributor plate from the first side to the second side. The first manifold is coupled to the first distributor plate and includes a partition wall separating the plurality of injection ports and the plurality of extraction ports on the first side. The heat spreader may be positioned between the object and the second side of the first distributor plate. The heat spreader may include a top surface and a plurality of fins including a first fin having opposite planar faces and an edge extending between the opposite planar faces, the plurality of fins extending upwards from the top surface, the second side of the first distributor plate may oppose the first fin and provide cooling thereto.

In certain instances, the second side of the first distributor plate may include a planar surface may oppose one of the opposite planar faces of the first fin.

In certain instances, the device further may include a second distributor plate, and a second manifold coupled to the second distributor plate, and wherein the second distributor plate may oppose the first fin and provide cooling thereto. In certain instances, the second side of the first distributor plate may include a planar surface opposing a first of the opposite planar faces of the first fin, and a planar surface of the second distributor plate may oppose a second of the opposite planar faces of the first fin.

In certain instances, the cooling fluid is air. In certain instances, the air is unconditioned air.

In certain instances, at least one of the first distributor plate and the first manifold is manufactured from a low thermal conductive material. In certain instances, the low thermal conductive material is plastic.

Aspects of the present disclosure may include an impingement cooling system for providing air to a component of a unit housed in a server rack for cooling. The impingement cooling system may include a first fan and a first duct, a second fan and a second duct, and an impingement unit. The first fan may force the air through the first duct and into the server rack. The second fan may pull the air from the server rack and into the second duct. The impingement unit may include an air pump, a manifold, and a distributor plate having a plurality of injection ports and extraction ports extending there through, the distributor plate may be positioned adjacent the component of the unit housed in the server rack. The manifold may include an outlet end and an inlet end, the manifold may be positioned adjacent the distributor plate so as to partition the injection ports and the extraction ports on one side the of the distributor plate. The air pump may facilitate air flow from the inlet end of the manifold to the outlet end of the manifold, the inlet end of the manifold in fluid communication with the first duct and the outlet end of the manifold in fluid communication with the second duct.

In certain instances, the first fan and the second fan are positioned outside the server rack. In certain instances, the air is unconditioned air.

In certain instances, the system further may include a precooling system for lowering the temperature of the air prior to entering the server rack, the precooling system in fluid communication with the first duct.

In certain instances, the precooling system may include at least one of the following: a chilled water loop; an evaporative cooling system; an indirect evaporative cooling system; a dedicated vapor-compression system; and a cold thermal storage depletion system.

In certain instances, the system further may include a humidity control system may monitor and alter humidity of the air prior to entering the server rack. In certain instances, the system further may include a filtering system to filter the air prior to entering the server rack.

In certain instances, the system further may include a preheating system for raising the temperature of the air prior to entering the server rack, the preheating system in fluid communication with the first duct.

Aspects of the present disclosure may include a distributor plate of an impingement cooling system. The distributor plate may include a housing including a first end and a second end opposite the first end, a first flow path structure may include a capillary root splitting structure coupled to the housing and may include at least one first inlet port at the first end, a plurality of first outlet ports at the second end, and a first conduit coupled to at least one first inlet port and the plurality of first outlet ports such that the at least one first inlet port and the plurality of first outlet ports are in fluid communication with each other. The first conduit may include a plurality of junctures that split the first conduit into pairs. The distributor plate further includes a second flow path structure coupled to the housing and may include at least one second port at the first end, at least one port at the second end, and a second conduit coupled to the at least one second ports at the first and second ends such that the at least one second ports at the first and second ends are in fluid communication with each other, the first and second conduits being isolated from each other within the housing. In certain instances, successive junctures of the plurality of junctures split in generally orthogonal directions.

Aspects of the present disclosure may include an impingement cooling device for providing cooling fluid to an object. The impingement cooling device may include a distributor plate, a manifold, and a heat spreader. The distributor plate includes a first side, a second side opposite the first side, a plurality of injection ports extending through the distributor plate from the first side to the second side, and a plurality of extraction ports extending through the distributor plate from the first side to the second side. The manifold is coupled to the distributor plate and including a partition wall separating the plurality of injection ports and the plurality of extraction ports on the first side. The heat spreader at least partially covers the object and includes a top surface that opposes the second side of the distributor plate, the heat spreader further includes a surface feature on the top surface to increase heat transfer therefrom.

In certain instances, the heat spreader is in thermal contact with the object via a thermal interface material.

In certain instances, the surface feature on the top surface of the heat spreader may include surface etching or machining. In certain instances, the surface feature on the top surface of the heat spreader may include surface protrusions extending upwards from the top surface.

In certain instances, the surface protrusions are offset from the plurality of injection ports and the plurality of extraction ports on the second side of the distributor plate when the top surface of the heat spreader opposes the second side of the distributor plate.

In certain instances, the surface protrusions are positioned laterally between the plurality of injection ports and the plurality of extraction ports on the second side of the distributor plate when the top surface of the heat spreader opposes the second side of the distributor plate.

In certain instances, the distributor plate and the manifold are separate components coupled together.

Aspects of the present disclosure may include an impingement cooling device for providing cooling fluid to an object on a board. The object includes a top surface and side surfaces. The impingement cooling device may include a distributor plate, and a manifold. The distributor plate may include a first side, a second side opposite the first side, a plurality of injection ports extending through the distributor plate from the first side to the second side, and a plurality of extraction ports extending through the distributor plate from the first side to the second side. The manifold being a separate component from and may couple to the distributor plate, the manifold including a partition wall may separate the plurality of injection ports and the plurality of extraction ports on the first side of the distributor plate when the manifold is coupled to the distributor plate.

In certain instances, a heat spreader may be positioned over the object and extend down to the board, the heat spreader in thermal contact with the object via a thermal interface material on the top surface of the object, the heat spreader being in non-contact with the side surfaces of the object, the heat spreader including a top surface that may oppose the second side of the distributor plate.

In certain instances, the heat spreader further includes a surface feature on the top surface to increase heat transfer therefrom. In certain instances, the surface feature on the top surface of the heat spreader may include surface etching or machining. In certain instances, the surface feature on the top surface of the heat spreader may include surface protrusions extending upwards from the top surface. In certain instances, the surface protrusions are offset from the plurality of injection ports and the plurality of extraction ports on the second side of the distributor plate when the top surface of the heat spreader opposes the second side of the distributor plate.

In certain instances, the surface protrusions are positioned laterally between the plurality of injection ports and the plurality of extraction ports on the second side of the distributor plate when the top surface of the heat spreader opposes the second side of the distributor plate.

BRIEF DESCRIPTION OF THE DRAWINGS

Implementations of the present technology will now be described, by way of example only, with reference to the attached figures, wherein:

FIG. 3A is a bottom side view of a distributor plate.

FIG. 3B is a cross-sectional side view of a distributor plate.

DETAILED DESCRIPTION

Figure 1A:
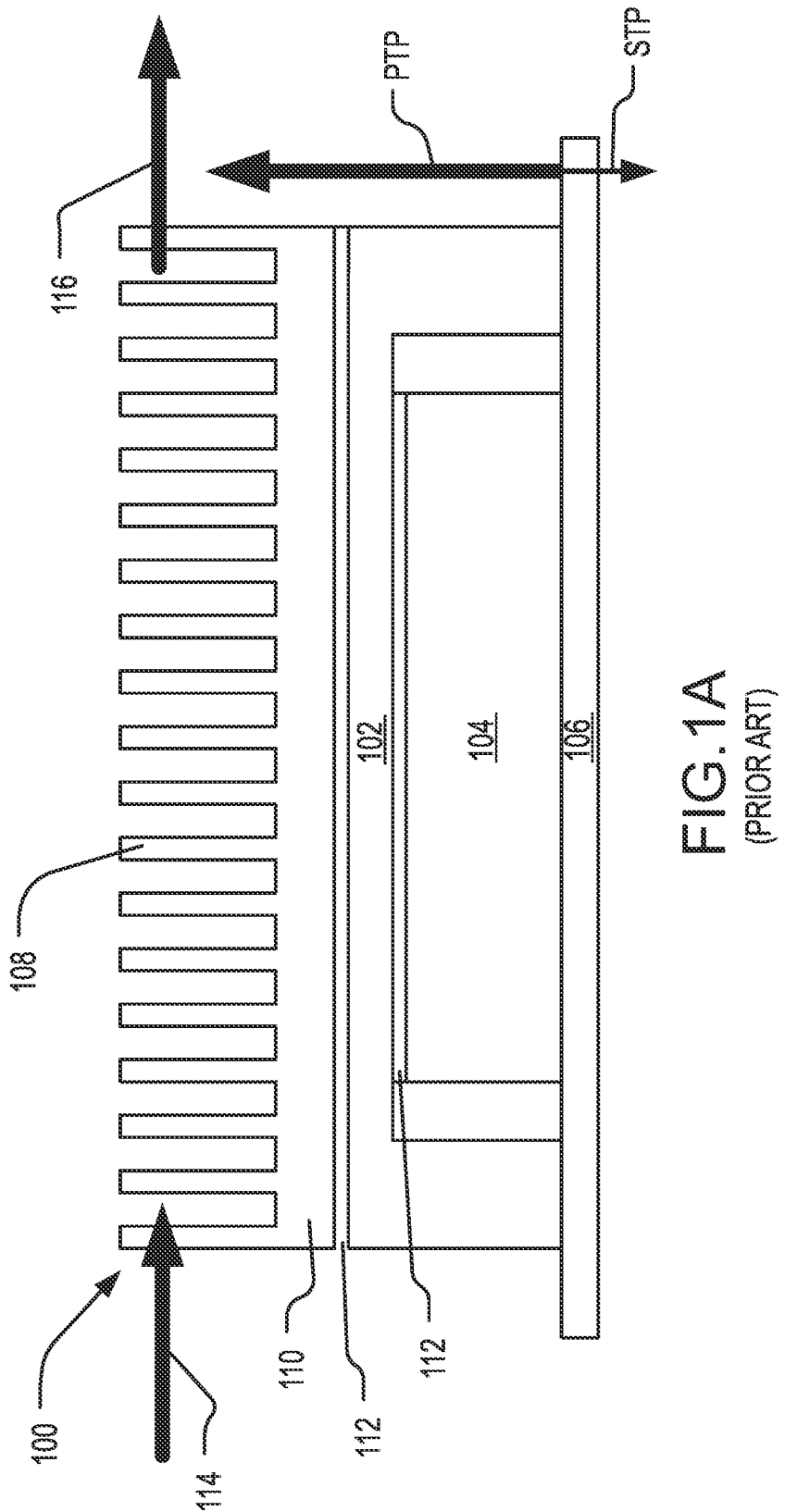
FIG. 1A is a cross-sectional side view of a conventional heat sink coupled to a lid that is coupled to an IC.
Figure 1B:
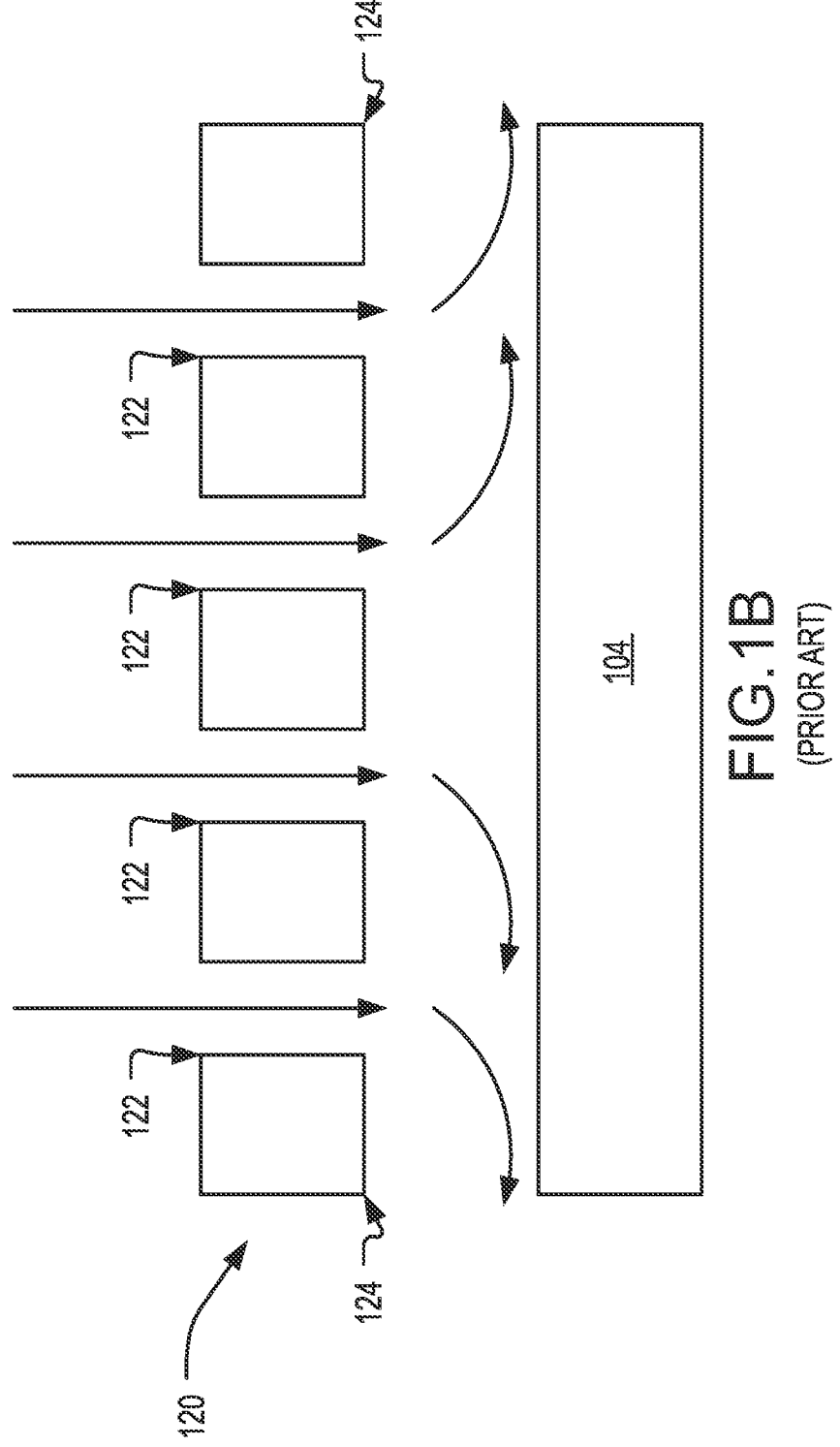
FIG. 1B is a cross-sectional side view of a conventional jet impingement plate coupled to an IC.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Figures 2A, 2B:
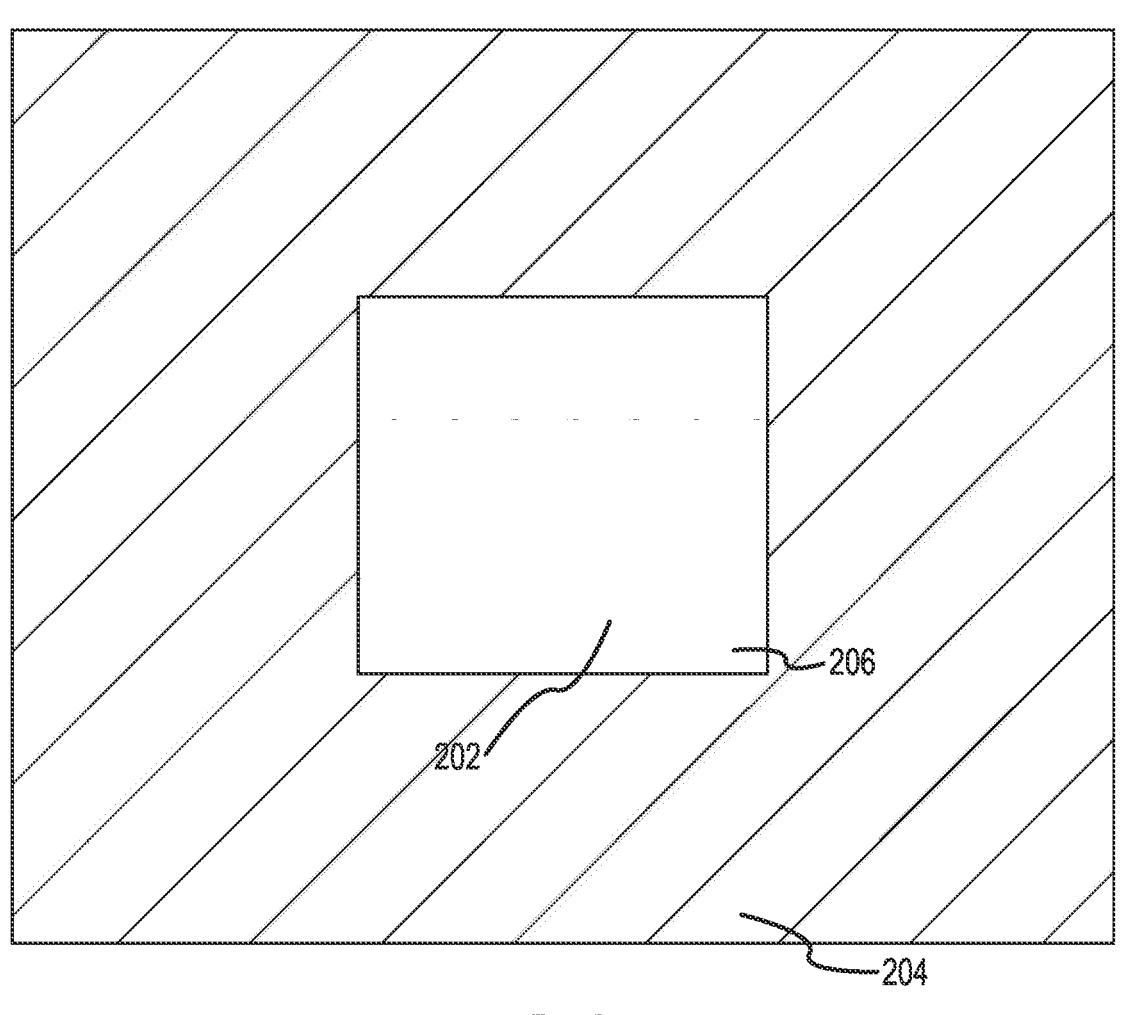
FIG. 2A is a top view of a heat spreading lid covering an object that is coupled to a board.
FIG. 2B is a cross-sectional side view of a jet impingement cooling device coupled to a lid that is atop an object on a board.

FIGS. 2A and 2B illustrate, respectively, a top view and a cross-sectional side view of a jet impingement cooling device 200, a lid 206, and an object 202 to be cooled. The object 202 may be an IC such as an ASIC, or FPGA or another type of electronic device that produces heat and in need of cooling. The object 202 is shown mounted to a board 204, such as a printed circuit board (PCB). As seen in the figures, the jet impingement cooling device 200 is positioned over a heat spreading lid 206 fitting at least partially over the object 202. The lid 206 is thermally bonded to the object 202 via a thermal interface material (TIM) 218. The jet impingement device 200 includes distributor plate 208 (may also be referred to as a distribution plate or an impingement plate) positioned adjacent the top of the lid 206, and a manifold 210, which is positioned on top of the distributor plate 208. The distributor plate 208 including injection and extraction ports for the cooling fluid to flow there through, and the manifold 210 directs fluid flow to the inlet port and from the exit port. As seen in FIGS. 2A and 2B, the lid 206 covers the entire top surface of the object 202, and the four sides extending down to the PCB 204. That is, the footprint of the heat spreading lid 206 is larger than the footprint of the object 202.

FIGS. 3A and 3B illustrate, respectively, a bottom view and a cross-sectional side view of the distributor plate 208. As seen in the figures, the distributor plate 208 includes a series of injection ports 212 and a series of extraction ports 214 spaced apart on the plate. The injection ports 212 and extraction ports 214 may be arranged in alternating rows, as seen in FIG. 3A. The injection ports 212 receive cooling fluid from a pump (not shown) that pumps the fluid through a manifold (not shown). The cooling fluid travels through the injection ports 212 and contacts the lid 206, which heats up from being in contact with the object (not shown in FIGS. 3A-3B) via the TIM (not shown in FIGS. 3A-3B). The cooling fluid is then forced to the extraction ports 214, which makes way for additional cooling fluid to enter through the injection ports 212. As seen in FIG. 3B, within the cooling area 215, the openings of the injection ports 212 are narrower than the openings of the extraction ports 214. The pressurized flow of the cooling fluid from the injection ports 212 causes the cooling fluid to flow out of the cooling area 215 through the relatively wider and lower pressure extraction ports 214.

Figure 3C:
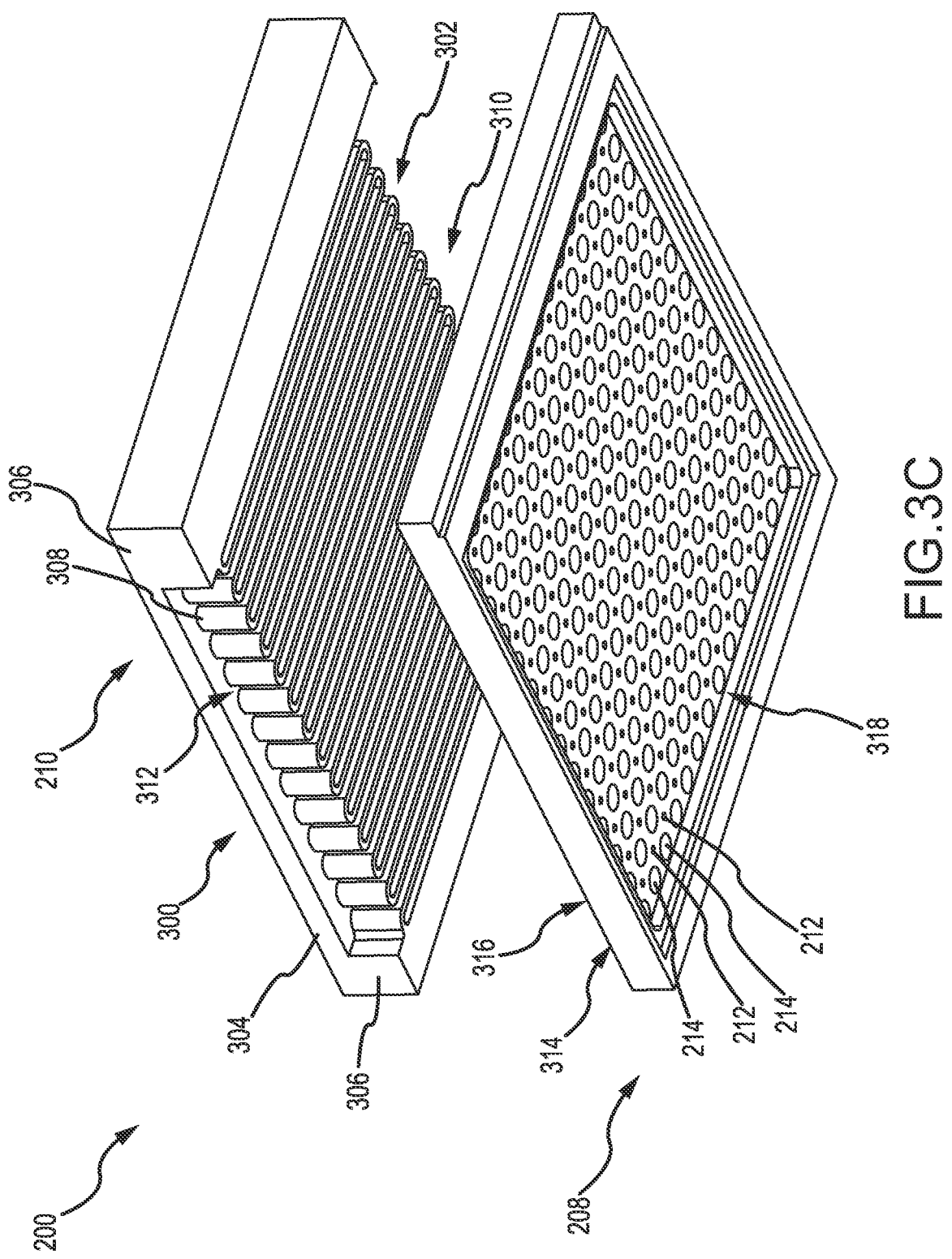
FIGS. 3C-3E are, respectively, an isometric bottom view, an isometric top view, and a bottom-side view of a manifold and a distributor plate spaced apart relative to each other.
Figure 3D:
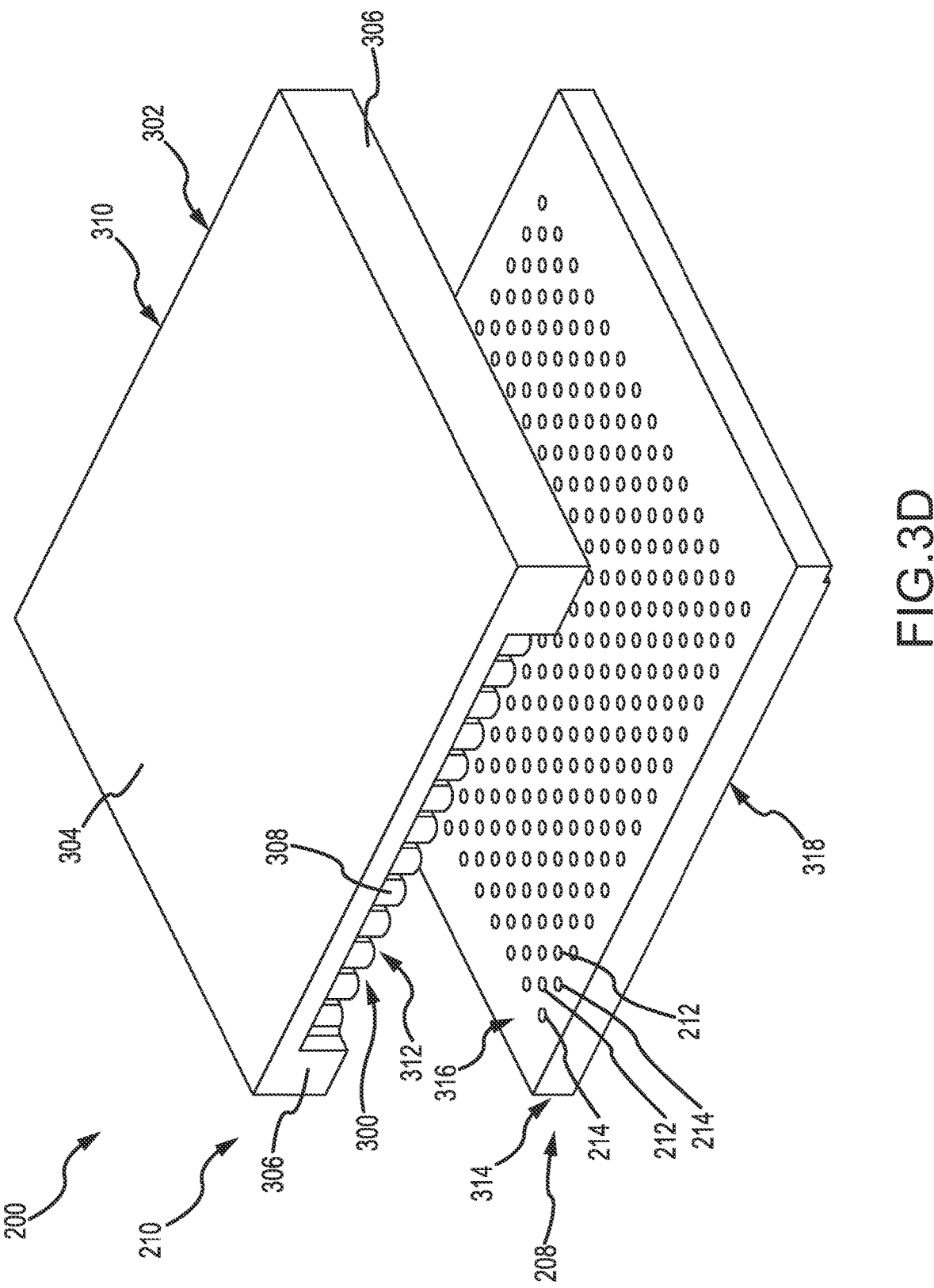
Figure 3E:
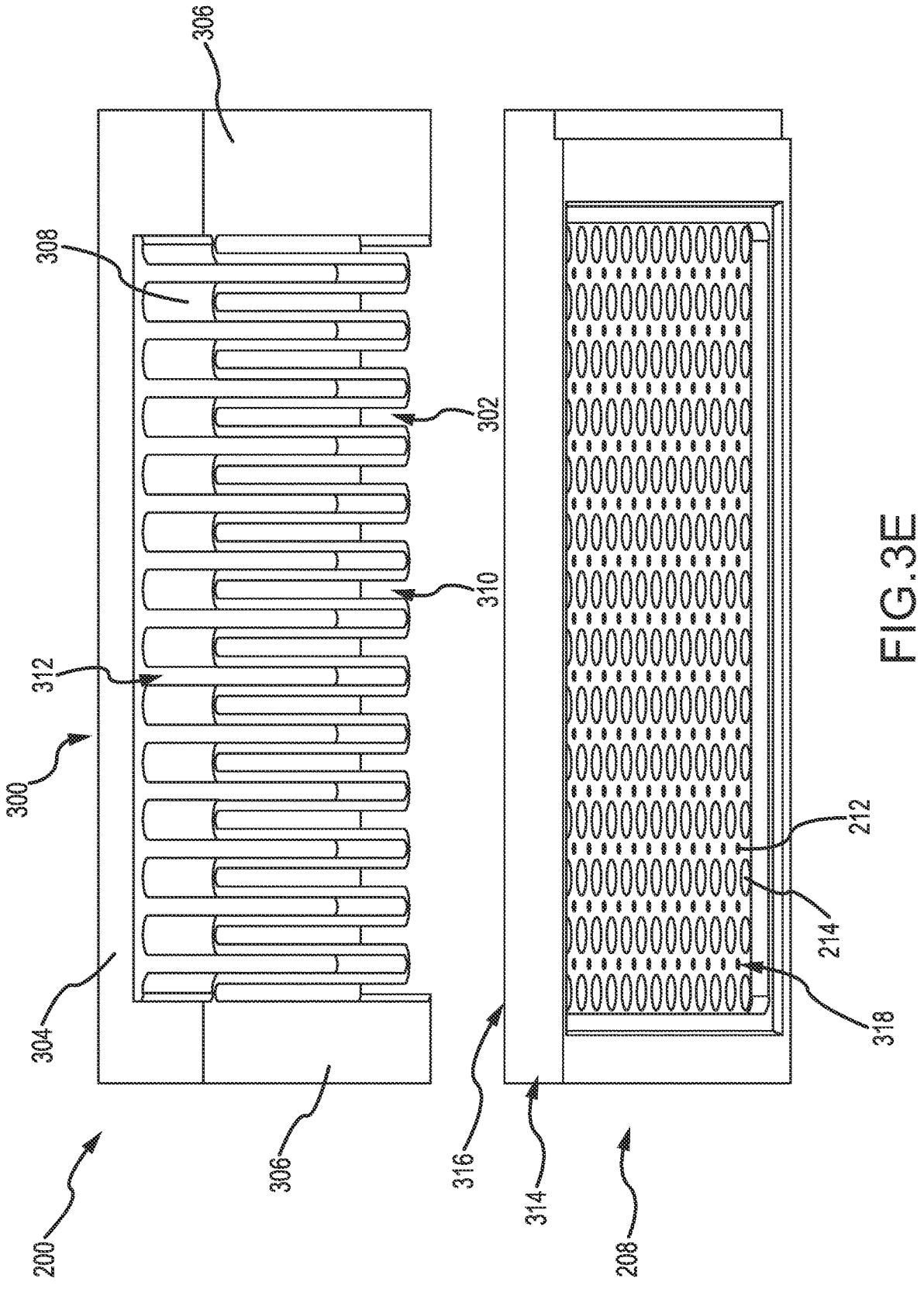
Figure 3F:
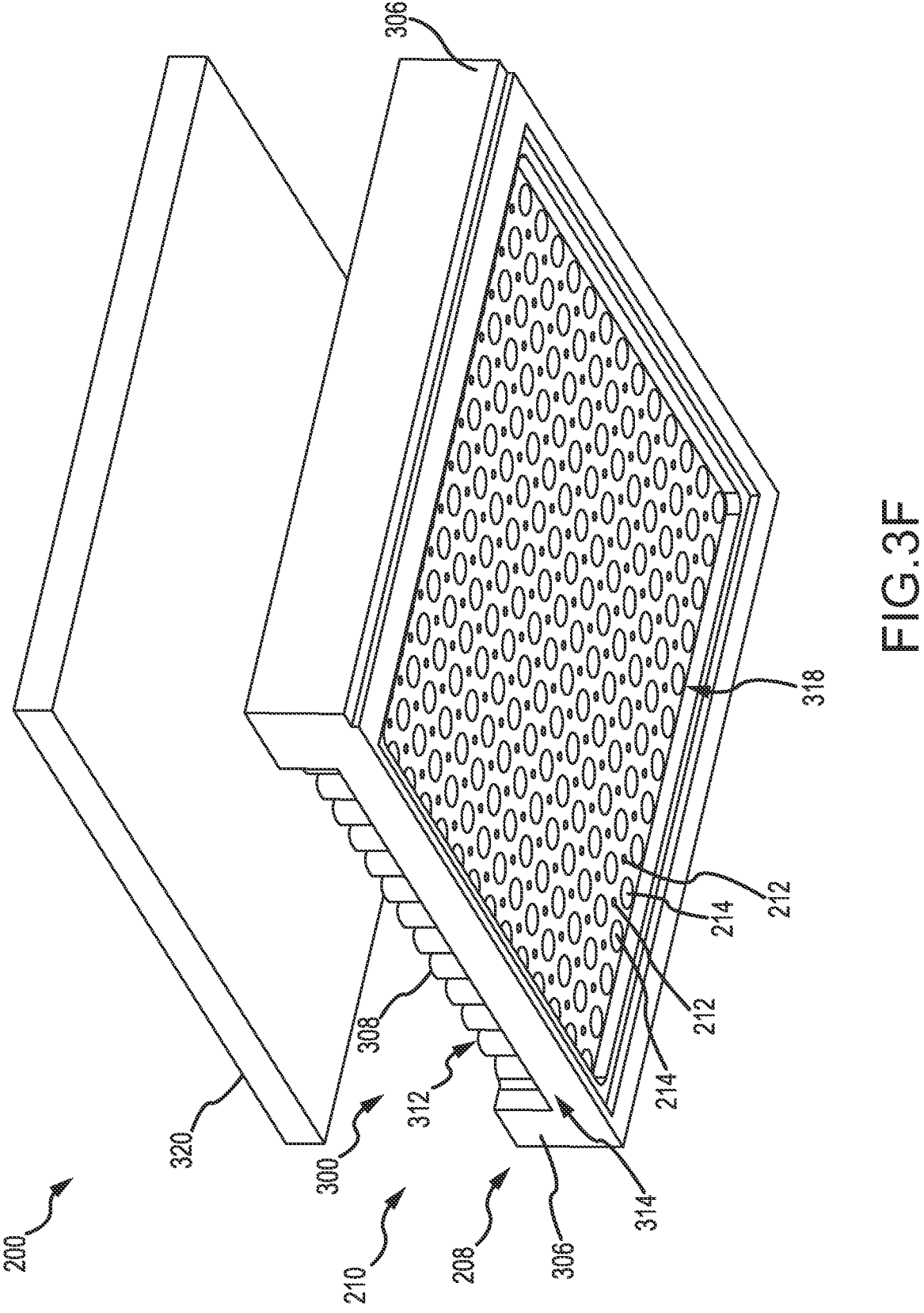
FIGS. 3F and 3G are, respectively, an isometric bottom view and an isometric top view of the impingement cooling device in another instance.
Figure 3G:
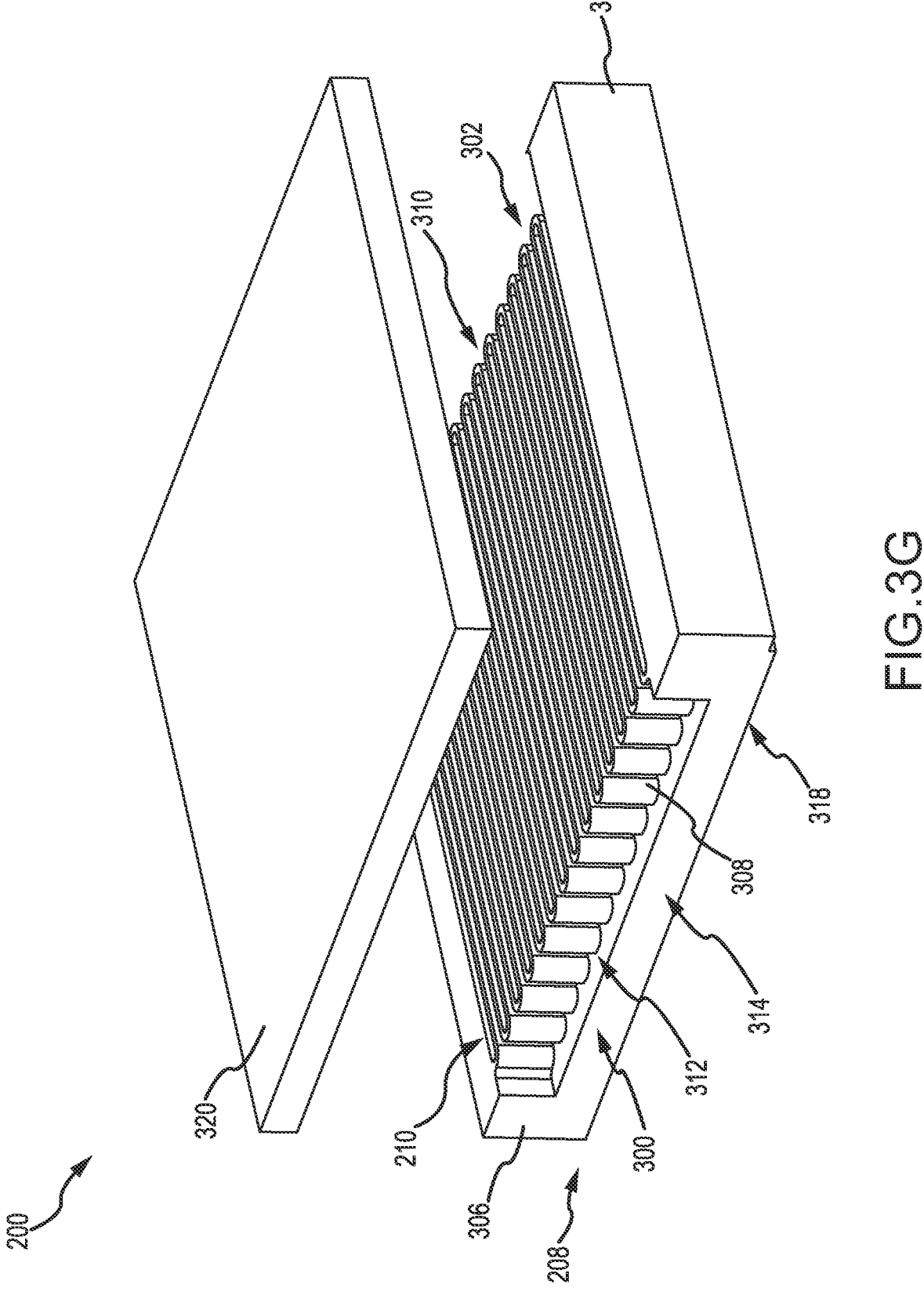

FIGS. 3C-3G illustrate how the manifold 210 integrates with the distributor plate 208 to direct fluid flow to and from the injection and extraction ports of the distributor plate 208. More particularly, FIGS. 3C-3E illustrate a first instance of a multi-part impingement cooling device 200, and FIGS. 3F and 3G illustrate a second instance of a multi-part impingement cooling device 200. A multi-part impingement cooling device 200 such as shown in FIGS. 3C-3G may be beneficial for manufacturing, as the individual parts may be injection molded. In some single-piece designs, the only viable option for manufacturing may be three-dimensional printing, which can be expensive and made in low-volume production. Thus, it may be desirable in certain instances to utilize impingement cooling devices 200 that can be injection molded.

FIGS. 3C-3E illustrate, respectively, an isometric bottom view, an isometric top view, and a bottom-side view of the manifold 210 and the distributor plate 208 spaced apart relative to each other. As seen in the figures, the manifold 210 and the distributor plate 208 are separate components. The manifold 210 includes an inlet end 300, an outlet end 302, a backing plate 304, a pair of side walls 306, and an inner partition wall 308 that extends or snakes back and forth between the inlet end 300 and outlet end 302 to define a plurality of outlet channels 310 and a plurality of inlet channels 312. The inlet channels 312 extend from the inlet end 300 towards the outlet end 302 but are stopped short of reaching the outlet end 302 by the partition wall 308. Similarly, the outlet channels 310 extend from the outlet end 302 towards the inlet end 300 but are stopped short of reaching the inlet end 300 by the partition wall 308. In this way, fluid entering the inlet end 300 via the inlet channels 312 is prevented from mixing with the fluid in the outlet channels 310 while in the manifold 210.

The distributor plate 208 includes a plate 314 having a top side 316 and a bottom side 318. The plate 314 includes a series of injection ports 212 and extraction ports 214 arranged in rows. The injection ports 212 have a larger cross-sectional area at the top side 316 of the plate 314 than at the bottom side 318 of the plate 314. The extraction ports 214 have a smaller cross-sectional area at the top side 316 of the plate 314 than at the bottom side 318 of the plate 314. As seen in FIG. 3C, each injection port 212 is surrounded by four extraction ports 214, and each extraction port 214 is surrounded by four injection ports 212.

The manifold 210 and the distributor plate 208 may be manufactured separately, and then coupled together to form the assembled impingement cooling device 200. In the assembled state, the injection ports 212 on the top side 316 of the plate 314 of the distributor plate 208 open into the inlet channels 312, and the extraction ports 214 on the top side 316 of the plate 314 of the distributor plate 208 open into the outlet channels 310. Thus, in operation, fluid may enter the inlet channels 312 on the inlet end 300 of the manifold 210, enter the injection ports 212 of the top side 316 of the plate 314 of the distributor plate 208, flow out the injection ports 212 and cool the object (not shown), and flow into the extraction ports 214 on the bottom side 318 of the plate 314 and flow out of the extraction ports 214 on the top side 316 of the plate so as to enter the outlet channels 310 of the manifold 210 towards the outlet end 302.

FIGS. 3F and 3G illustrate, respectively, an isometric bottom view and an isometric top view of the impingement cooling device 200 in another instance. In this instance, a part of the manifold 210 is integral with the distributor plate 208, and a separate cover plate 320 is manufactured for coupling to the manifold 210 and distributor plate 208. More particularly, the side walls 306 and partition wall 308 defining the inlet and outlet channels 312, 310 of the manifold 210 are coupled to the top side 316 of the plate 314 of the distributor plate 208. A separate cover plate 320 that may be manufactured, and then coupled to the top of the side walls 306 and partition wall 308 to complete the assembled impingement cooling device 200. The impingement cooling device 200 of FIGS. 3F and 3G may include the same or similar components as described with the device 200 of FIGS. 3C-3E.

Figure 3H:
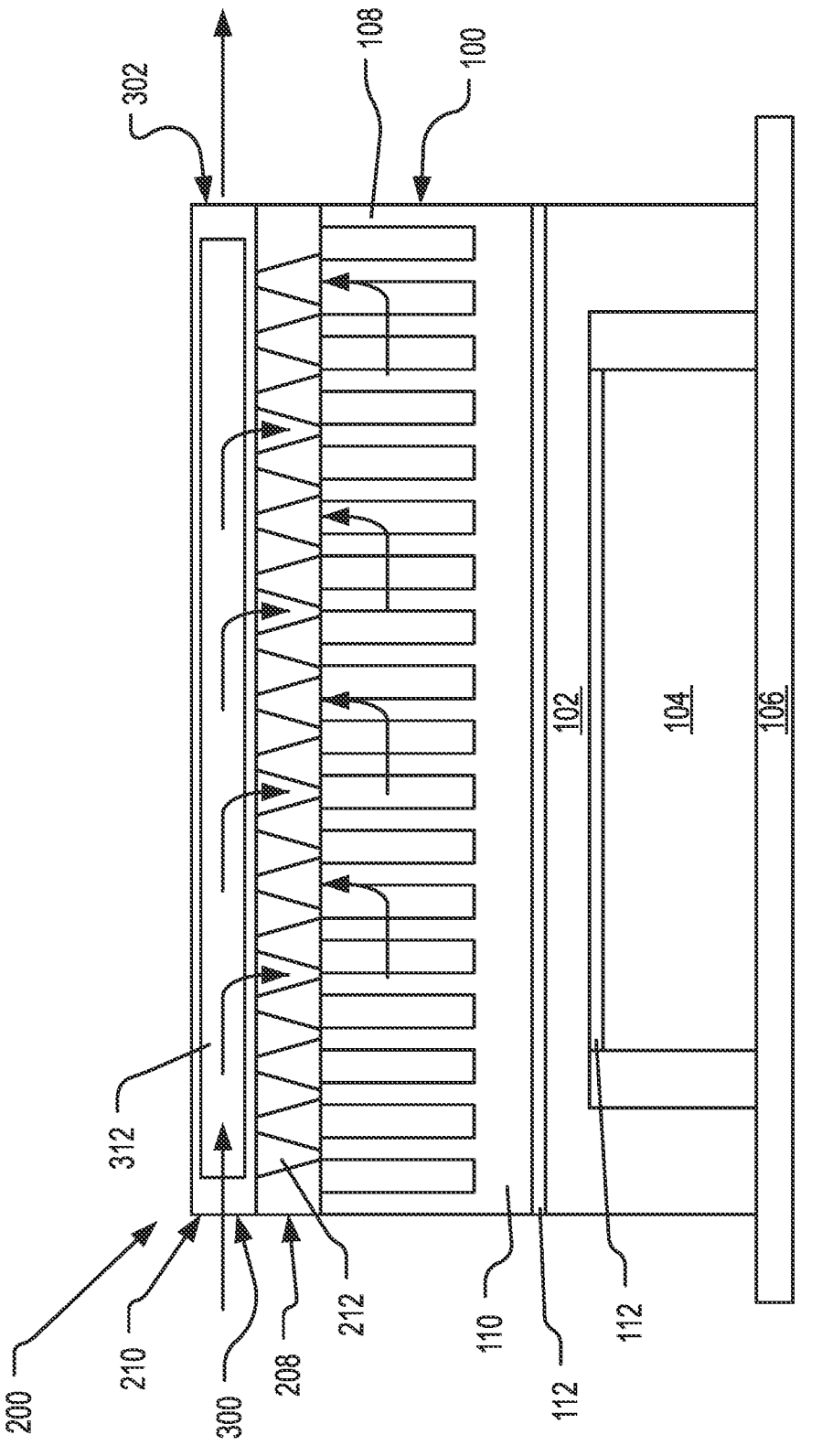
FIG. 3H is a cross-sectional side view of a jet impingement device positioned atop the fins of a heat sink.

FIG. 3H is a cross-sectional side view of a jet impingement device 200 positioned atop the fins 108 of a heat sink 100. As seen in the figure, the jet impingement device 200 includes a manifold 210 and a distributor plate 208, such as those shown and described with reference to FIGS. 3A-3G. A layer of TIM may be between jet impingement device 200 and the heat sink 100. The distributor plate 208 includes a plurality of injection ports 212 and a plurality of extraction ports (not shown in FIG. 3H because the cross-section is taken at a depth that intersects the injection ports 212, not the extraction ports. However, it is to be appreciated that the extraction ports are in the distributor plate 208). The injection ports 212 are in fluid communication with the inlet channels 312 of the manifold 210, and the extraction ports (not shown) are in fluid communication with the outlet channels (not shown in FIG. 3H).

As seen in FIG. 3H, fluid enters the inlet end 300 of the manifold 210 and is constrained to enter the inlet channels 312 that lead to the injection ports 212 of the distributor plate 208. The fluid flows through the injection ports 212 and contacts the fins 108 and the metal plate 110 of the heat sink 100 so as to provide a cooling effect to the heat sink 100, and ultimately the IC 104. The fluid is then received in the extraction ports (not shown) on the bottom of the distributor plate 208 and travels up to the outlet channels (not shown) of the manifold 210. The fluid path can be seen by the arrows in FIG. 3H.

Figure 4:
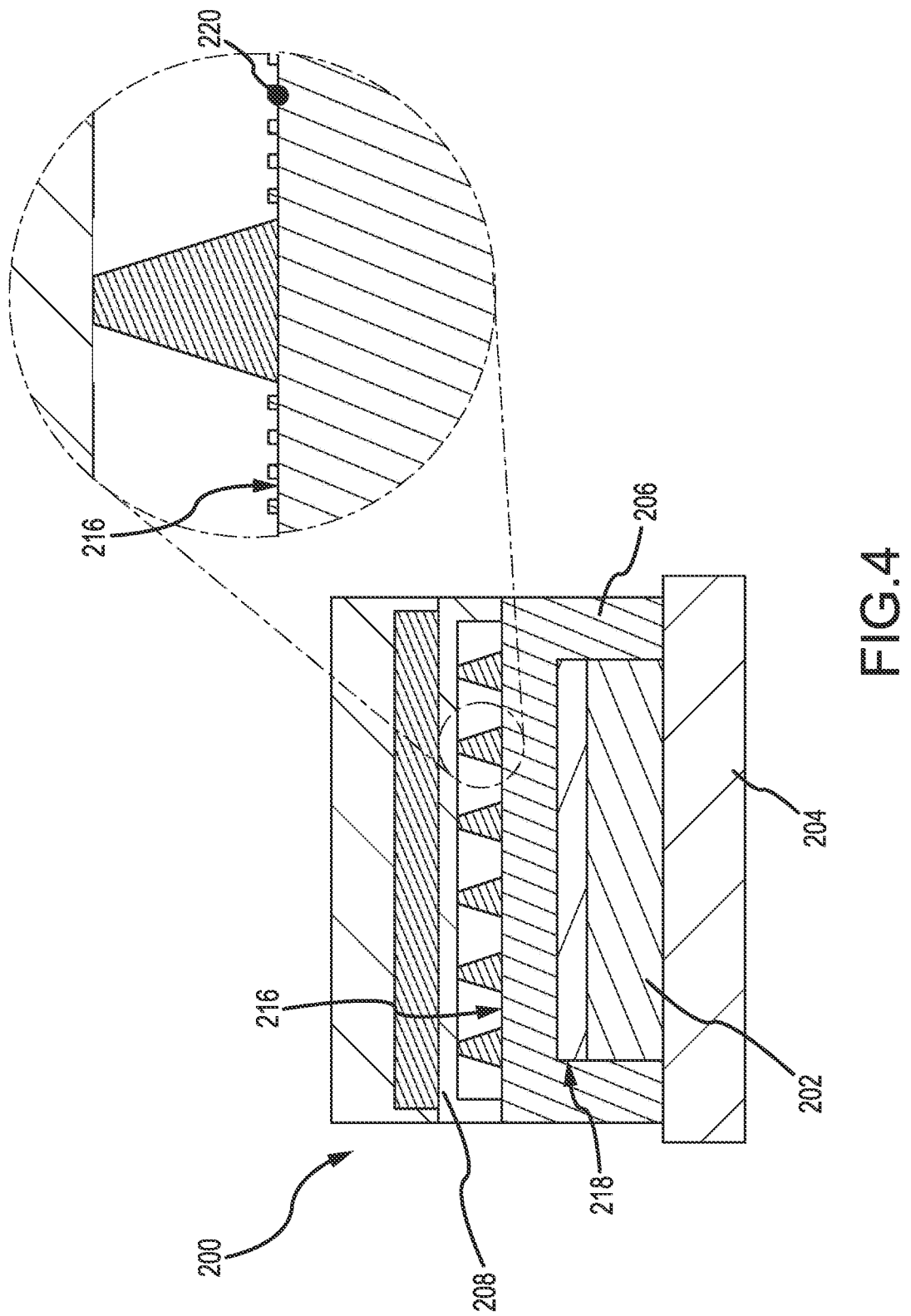
FIG. 4 is a cross-sectional side view of a jet impingement device coupled to a lid that is atop an object on a board, where the lid includes sub jet scale surface enhancements.

FIG. 4 illustrates the same cross-sectional side view of the jet impingement cooling device 200 and the object 202 to be cooled of FIG. 2B, except for a detailed view of a top surface 216 of the heat spreader lid 206. The top surface 216 of the lid 206 may include surface features 220 that increase the heat transfer rate between the lid 206 and the cooling fluid. As seen in the figure, the surface features 218 may include raised protrusions. The surface features 220 may be etched or machined into the surface 216. In both cases, these surface features may be integral features on the surface of the lid 206. The surface features 220 may be scaled smaller than the jet diameter of the injection port (i.e., sub-jet scale). Such a modification to the top surface 216 of the lid 206 does not require changes to the distributor plate 208. In certain instances, the surface features 220 may be a roughened surface, a grooved surface, a dimpled surface, etc. These surfaces features 220 improve the heat transfer performance by increasing the convective heat transfer coefficient and increasing the surface area for heat transfer.

Figure 5A:
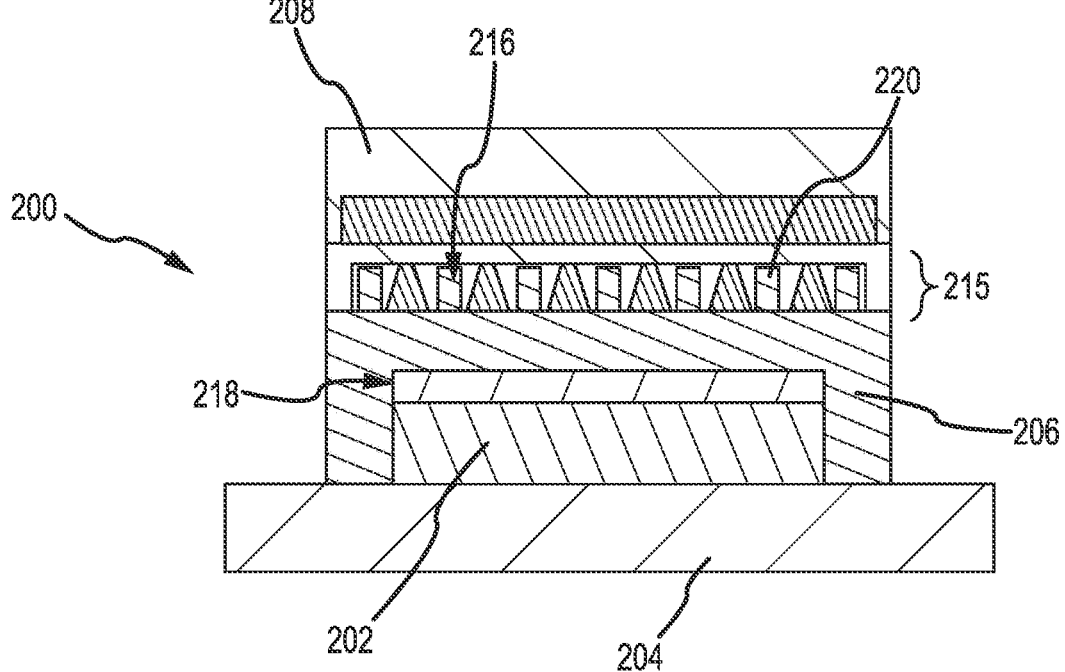
FIG. 5A is a cross-sectional side view of a jet impingement device coupled to a lid that is atop an object on a board, where the lid includes jet scale surface enhancements.

FIG. 5A illustrates the same cross-sectional side view of the jet impingement cooling device 200 and object to be cooled of FIG. 4, except a different and larger surface feature 220 is shown projecting from the top surface 216 of the heat spreading lid 206. As seen in the figure, the top surface 216 of the lid 206 includes a series of protrusions 220 extending or projecting upwards from the top surface 216. The scale of the surface features 220 are generally the same scale as the jet diameter of the injection and extraction ports (i.e., jet scale). The jet scale surface features 220 extend upwardly from the top surface 216 of the lid 206 so as to fill a portion of the cooling area 215 between the lid 206 and the distributor plate 208. The surface features 220 increase the overall surface area of the lid 206 for the dissipation of heat via fluid flow.

Figure 5B:
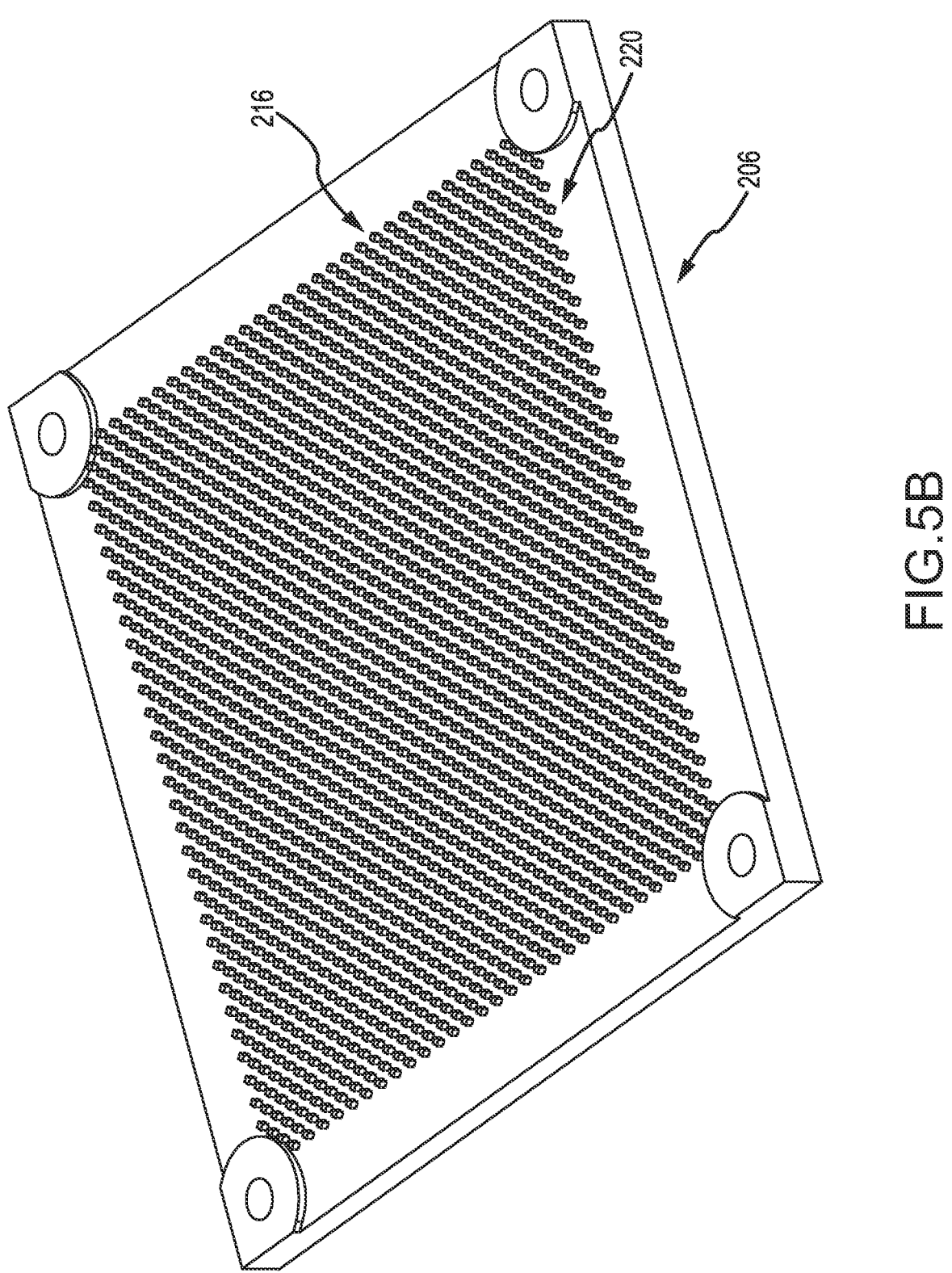
FIG. 5B is an isometric view of an exemplary lid having jet scale surface enhancements.

An exemplary lid 206 having jet-scale surface features 220 is shown in FIG. 5B. It is noted that a lid may also be called a heat spreader since such a structure as shown in FIG. 5B, among others, may be used on top of a lid with a TIM therebetween. As such, the terms lid and heat spreader may be used interchangeably. As an example, a heat spreader, such as shown in FIG. 5B, may be utilized in a retrofit application where the IC already includes a lid. The heat spreader may be positioned atop the lid with a TIM in between the lid and heat spreader.

As seen in the figure, surface features 220 in the form of pins, protrusions, or fins jut upwards from the top surface 216 of the lid 206. The pins are in rows covering the top surface 216 of the lid 206. The surface features 220 are oriented in such a way that, when the lid 206 is positioned adjacent the bottom surface of the distributor plate 208, the individual pins are offset from the injection ports 212 and extraction ports 214. This can be seen in FIG. 5C, which is a close-up top view of a portion of the lid 206. The larger circles indicate the locations of the extraction ports 214 on the bottom side of the distributor plate 208, and the smaller circles indicate the locations of the injection ports 212 on the bottom side of the distributor plate 208. In this way, the injection ports 212 and the extraction ports 214 are positioned between the upwardly extending surface features 220 of the lid 206. This way the fluid flowing from the injection ports 212 are freer to flow to the top surface 216 by the surface features 220.

Figure 5C:
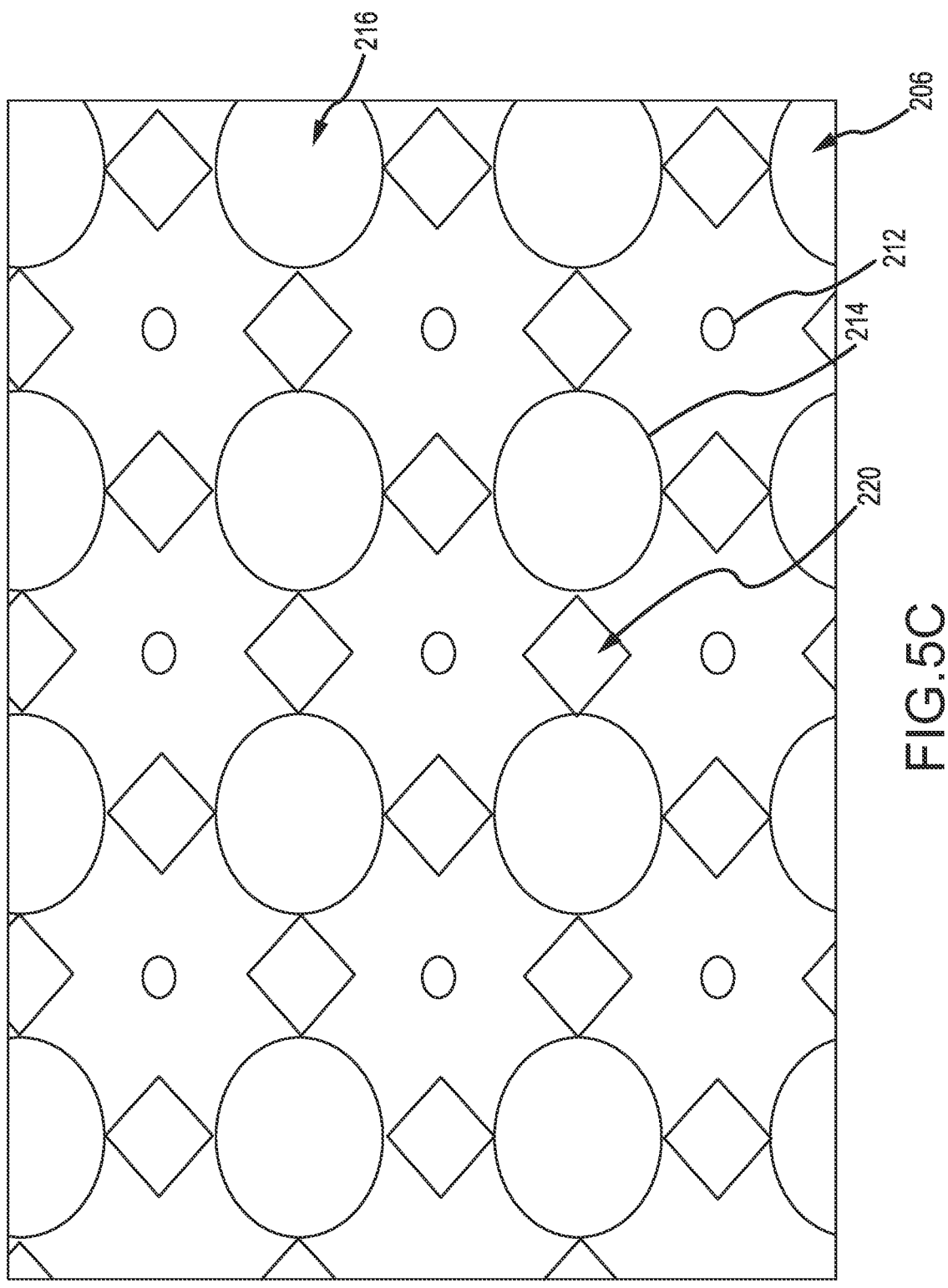
FIG. 5C is a close-up, top view of the lid of FIG. 5B showing locations of the injection and extraction ports of a distributor plate.

Surface features 220 shown in FIGS. 5B and 5C are a representative example with a rectangular shaped cross-section. Each feature may have the same height and may be isolated from one another except that each feature extends from surface 216. Other embodiments are possible with different cross-sectional shapes (e.g., circular, oval, etc.) and are connected to one-another in a plane above surface 216. The design of these features are intended to increase the surface area and increase the heat transfer coefficient, thereby lowering the temperature difference between surface 216 and the cooling fluid.

Figures 6A, 6B:
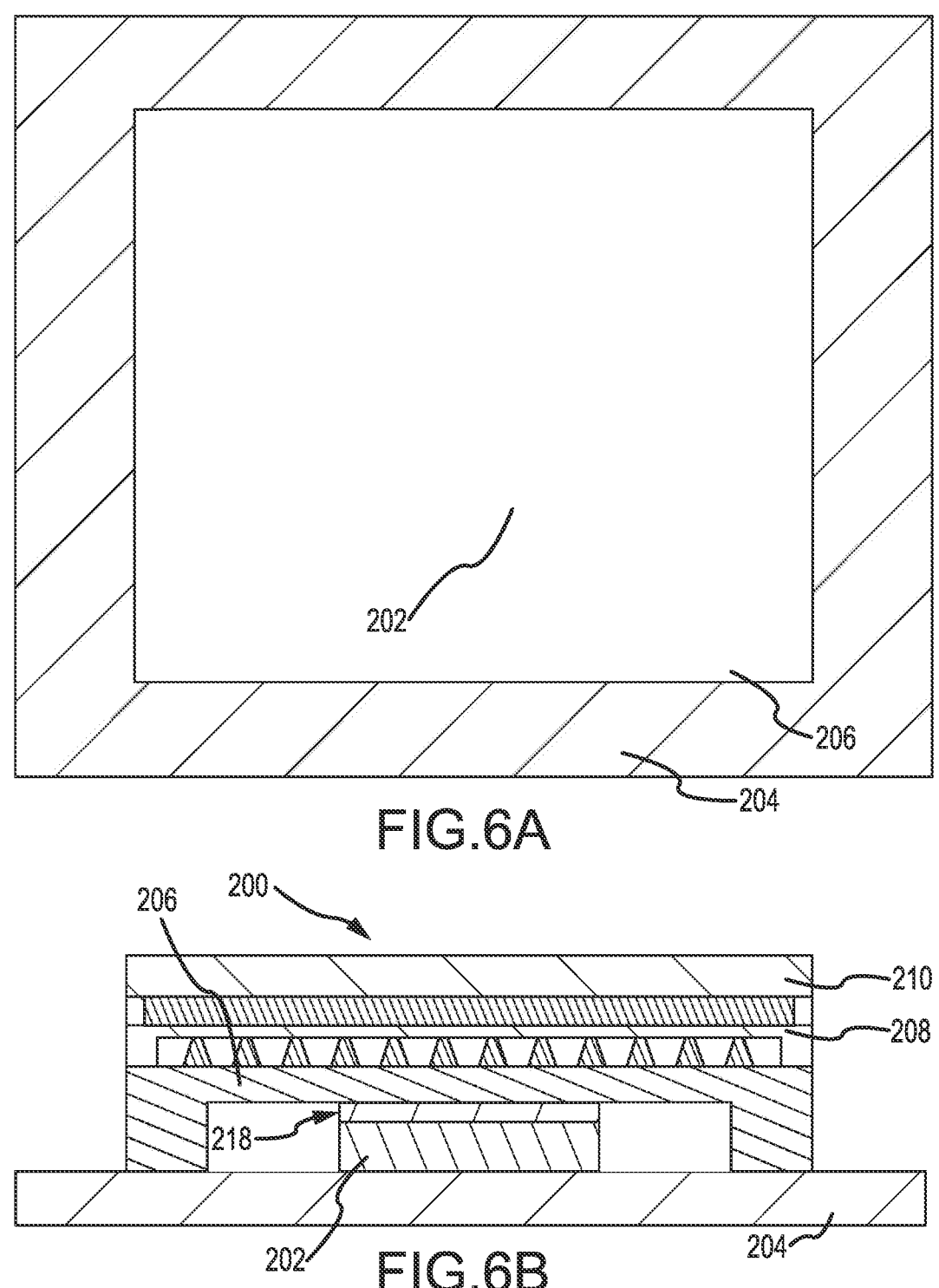
FIG. 6A is a top view of a heat spreading lid covering an object that is coupled to a board.
FIG. 6B is a cross-sectional side view of a jet impingement cooling device coupled to a lid that is atop an object on a board.

FIGS. 6A and 6B illustrate, respectively, a top view and a cross-sectional side view of a jet impingement cooling device 200 and an object 202 to be cooled. The jet impingement cooling device 200 in this instance illustrates another way to enhance the heat transfer from the object 202. In this instance, the size (i.e., surface area) of the lid 206 is enhanced. And the amount of cooling provided to the lid 206 is also increased.

As described with reference to the previous figures, the object 202 may be an IC such as an ASIC, or FPGA or another type of electronic device that produces heat and in need of cooling. The object 202 is shown mounted to the board 204, such as a printed circuit board (PCB). As seen in the figures, the jet impingement cooling device 200 is coupled to a heat spreading lid 206 fitting at least partially over the object 202. A thermal interface material (TIM) 218 thermally bonds the object 202 and the lid 206. The jet impingement cooling device 200 includes a distributor plate 208 and a manifold 210. The distributor plate 208 is positioned on top of the lid 206. The distributor plate 208 including injection and extraction ports for the cooling fluid to flow there through, and the manifold 210 directs fluid flow to the inlet port and from the exit port. As seen in FIGS. 6A and 6B, the lid 206 covers the entire top surface of the object 202, and extends laterally beyond the four sides extending down to the PCB 204. That is, the footprint of the heat spreading lid 206 is significantly larger than the footprint of the object 202. A volume of air is between the IC 202 and the lid 206 on the side surfaces of the IC 202. The larger surface area of the top side 216 of the lid provides an increased surface area for cooling via the cooling fluid. It is noted that the larger lid 206 in FIGS. 6A and 6B can include the sub jet scale surface features 220 of FIG. 4 and/or the jet-scale surface features 220 of 5A-5C.

Figures 7A, 7B:
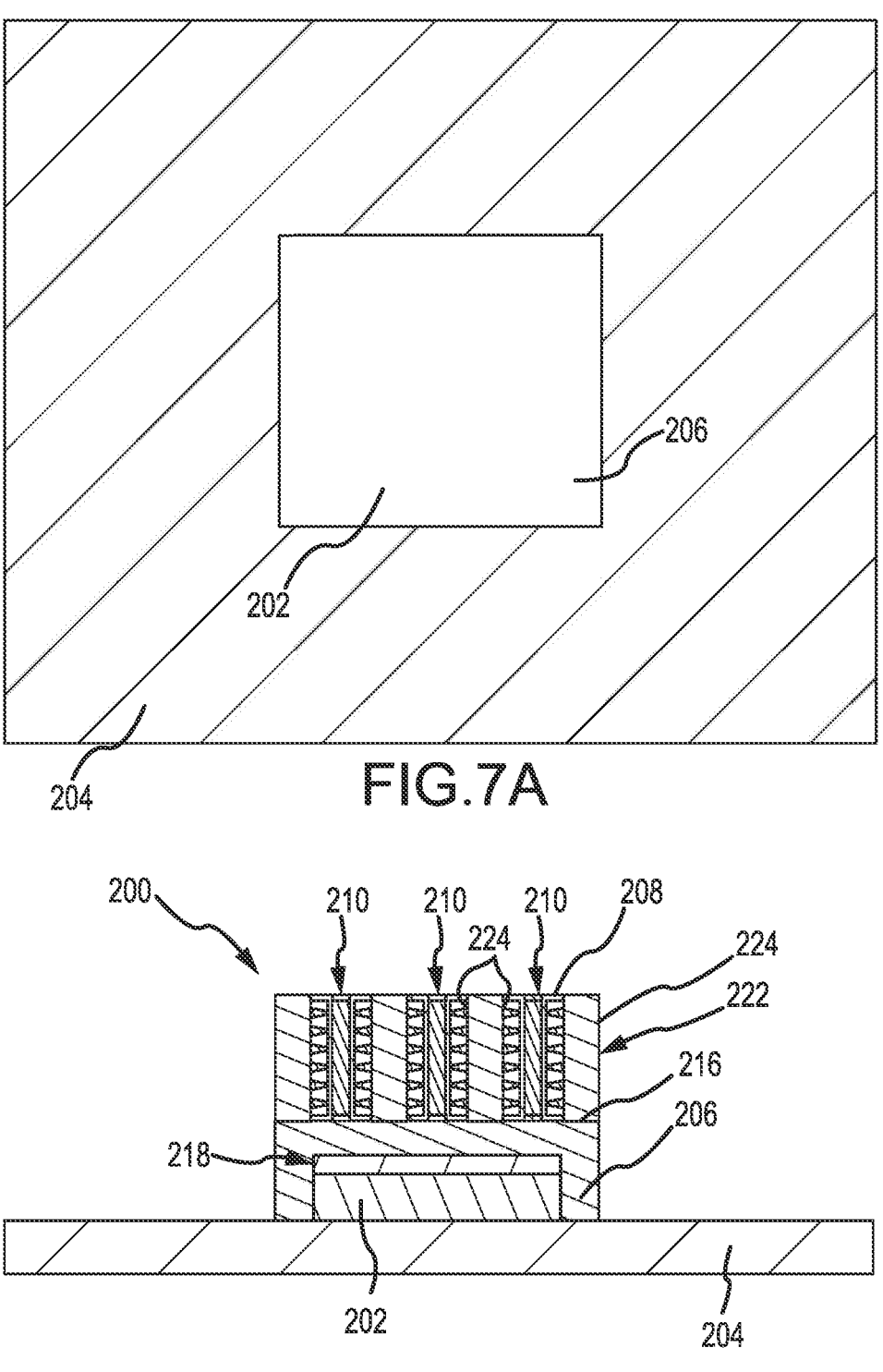
FIG. 7A is a top view of a heat spreading lid covering an object that is coupled to a board.
FIG. 7B is a cross-sectional side view of a jet impingement cooling device coupled to a lid that is atop an object on a board, where the lid includes a plurality of fins.

FIGS. 7A and 7B illustrate, respectively, a top view and a cross-sectional side view of a jet impingement cooling device 200 and an object 202 to be cooled. As described with reference to the previous figures, the object 202 may be an IC such as an ASIC, or FPGA or another type of electronic device that produces heat and in need of cooling. The object 202 is shown mounted to the board 204, such as a printed circuit board (PCB). As seen in the figures, the jet impingement cooling device 200 is mounted to a heat spreading lid 206 fitting at least partially over the object 202. More particularly, the lid 206 includes a top surface 216 and a plurality of fins 222 extending upwards there from. The fins 222 may extend linearly, in a parallel fashion with each other. The fins 222 define a pair of opposite faces 224. Opposing each face 224 of a pair of fins 222 is a distributor plate 208 having injection and extraction ports for facilitating the flow of a cooling fluid. As seen in the figures, a thermal interface material (TIM) 218 thermally bonds the object 202 and the bottom side of the lid 206. A cooling fluid manifold 210 directs the fluid flow to the injection ports of the distributor plates 208.

In this way, the cooling fluid flows through the manifolds 210 between the fins 222 and the cooling fluid enters the injection ports and is directed to the faces 224 of the fins 222. After contacting the faces 224 of the fins 222, the cooling fluid enters the extraction ports and flows back out of the distributor plate 208. It is noted that FIG. 7B shows a cross-section of the jet impingement cooling device 200 at a position of the inlet fluid flow (indicated by the blue arrows). Since the distributor plates 208 include alternating rows of injection ports and extraction ports, it can be appreciated that a similar cross-section could be taken at a different position showing the extraction ports and the outgoing fluid. It is noted, the faces 224 of the fins 222 may include the surface features 220 shown and described with reference to FIGS. 4 and 5A-5C.

Figures 8A, 8B:
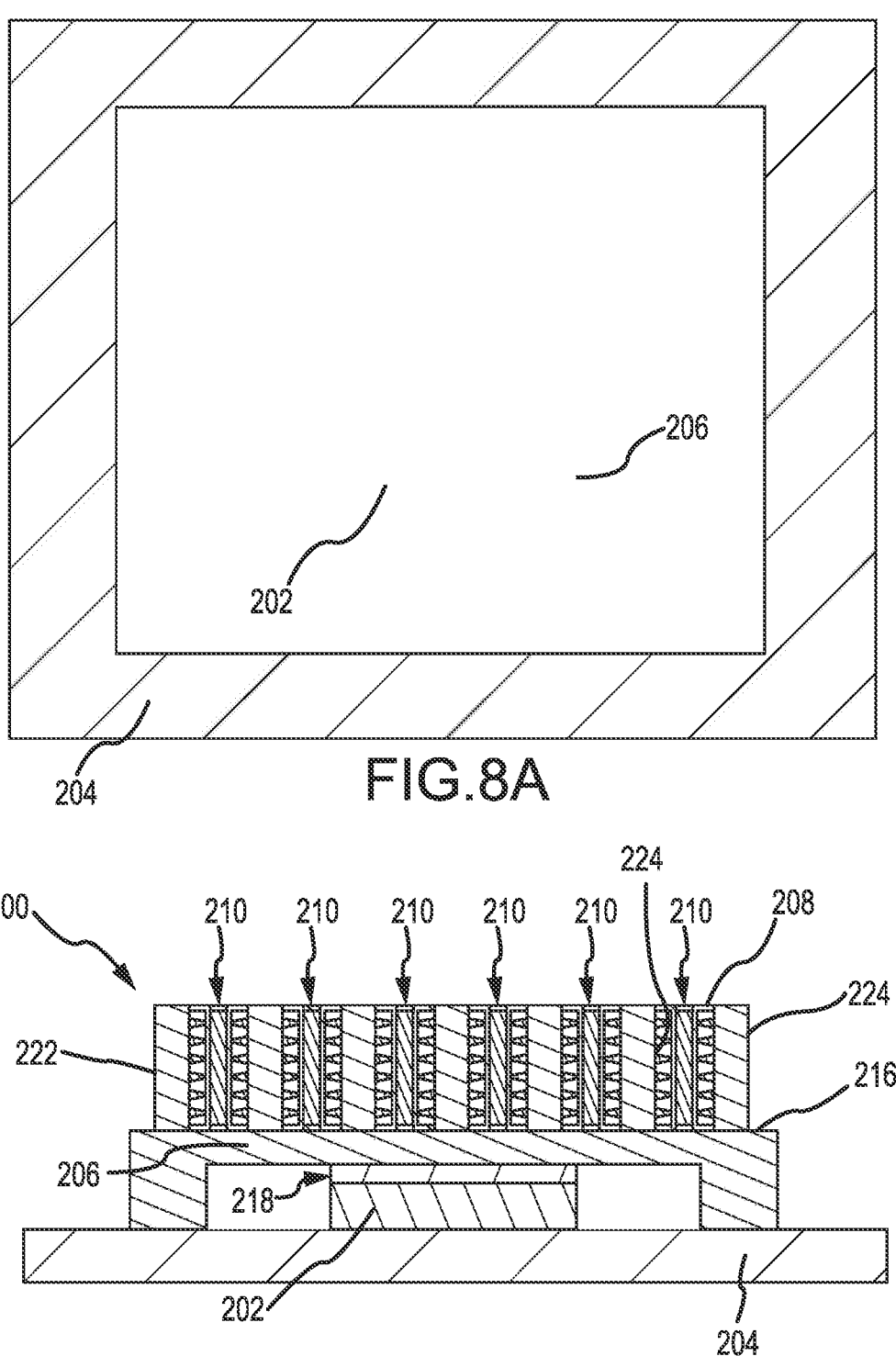
FIG. 8A is a top view of a heat spreading lid covering an object that is coupled to a board.
FIG. 8B is a cross-sectional side view of a jet impingement cooling device coupled to a lid that is atop an object on a board, where the lid is larger than the object and includes a plurality of fins.

FIGS. 8A and 8B, illustrate, respectively, a top view and a cross-sectional side view of a jet impingement cooling device 200 and an object 202 to be cooled. As described with reference to the previous figures, the object 202 may be an IC such as an ASIC, or FPGA or another type of electronic device that produces heat and in need of cooling. The object 202 is shown mounted to the board 204, such as a printed circuit board (PCB). As seen in the figures, the jet impingement cooling device 200 is mounted to a heat spreading lid 206 fitting at least partially over the object 202. More particularly, the lid 206 includes a top surface 216 and a plurality of fins 222 extending upwards there from. The fins 222 may extend linearly, in a parallel fashion with each other. The fins 222 define a pair of opposite faces 224. Opposing each face 224 of a pair of fins 222 is a distributor plate 208 having injection and extraction ports for facilitating the flow of a cooling fluid. As seen in the figures, a thermal interface material (TIM) 218 thermally bonds the object 202 and the bottom side of the lid 206. A fluid manifold 210 directs the fluid flow to the injection ports of the distributor plates 208, as well as directs the fluid flow exiting the extraction ports of the distributor plates 208. While FIG. 8B only depicts a blue arrow showing fluid flow into the fluid manifold 210, it is appreciated that an alternative cross-section, at a different depth, would show fluid flowing out of the fluid manifold 210. And while not depicted in detail in FIG. 8B, the distributor plate 208 and manifold 210 may be similar or the same to those shown and described with reference to 3A through 3G.

The heat spreading lid 206, in this instance, is larger than the IC 202 to which it is bonded. The lid 206 extends laterally over the top surface of the IC 202 so as to provide a gap between the inner sides of the lid 206 and the sides of the IC 202. This larger lid 206 provides an increase in surface area for additional fins 222 and distributor plates 208 for an increase in cooling effect.

In operation, the cooling fluid flows through the manifolds 210 between the fins 222 and the cooling fluid enters the injection ports and is directed to the faces 224 of the fins 222. After contacting the faces 224 of the fins 222, the cooling fluid enters the extraction ports and flows back out of the distributor plate 208. It is noted that FIG. 8B shows a cross-section of the jet impingement cooling device 200 at a position of the inlet fluid flow (indicated by the blue arrows). Since the distributor plates 208 include alternating rows of injection ports and extraction ports, it can be appreciated that a similar cross-section could be taken at a different position showing the extraction ports and the outgoing fluid. It is noted, the faces 224 of the fins 222 may include the surface features 220 shown and described with reference to FIGS. 4 and 5A-5C.

Figure 9:
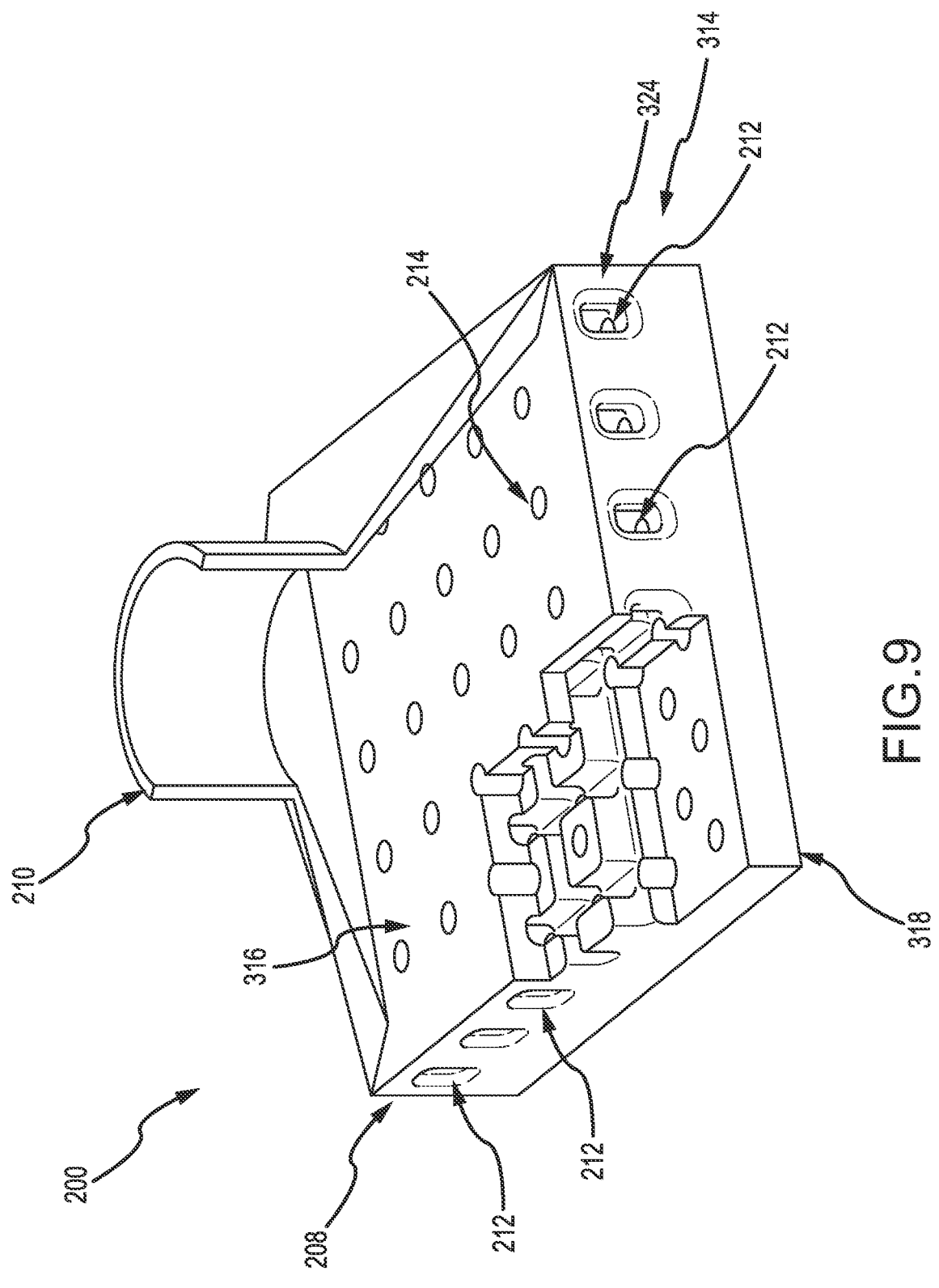
FIG. 9 is a sectional, isometric view of a distributor plate and manifold.

FIG. 9 illustrates an isometric, sectional view of a jet impingement device 200 according to the present disclosure. The jet impingement device includes a distributor plate 208 having a plate 314, a top surface 316, a bottom surface 318, and four side walls 324. Additionally, the distributor plate 208 includes a plurality of injection ports 212 extending into the side walls 324 and exiting the bottom surface 318, and plurality of extraction ports 214 extending into the bottom surface 318 and exiting the top surface 318. A manifold 210 is coupled to the top surface 318 for funneling the exiting fluid from the extraction ports 214. As seen in FIG. 9, the fluid enters the injection ports 212 around the perimeter of the device 200. The fluid enters the injection ports 212, and once in the plate 314, turn towards the bottom surface 318. The fluid exits the injection ports 212 at the bottom surface 318 and cools the object (not seen). The fluid then enters the extraction ports 214 on the bottom surface 318 and flows upwards through the plate 314 to the manifold 210. The jet impingement device 200 shown in FIG. 9, may be utilized with the lid 206 and the surface enhancements 220 of any of FIGS. 4-6 to enhance the cooling of the object.

Figure 10A:
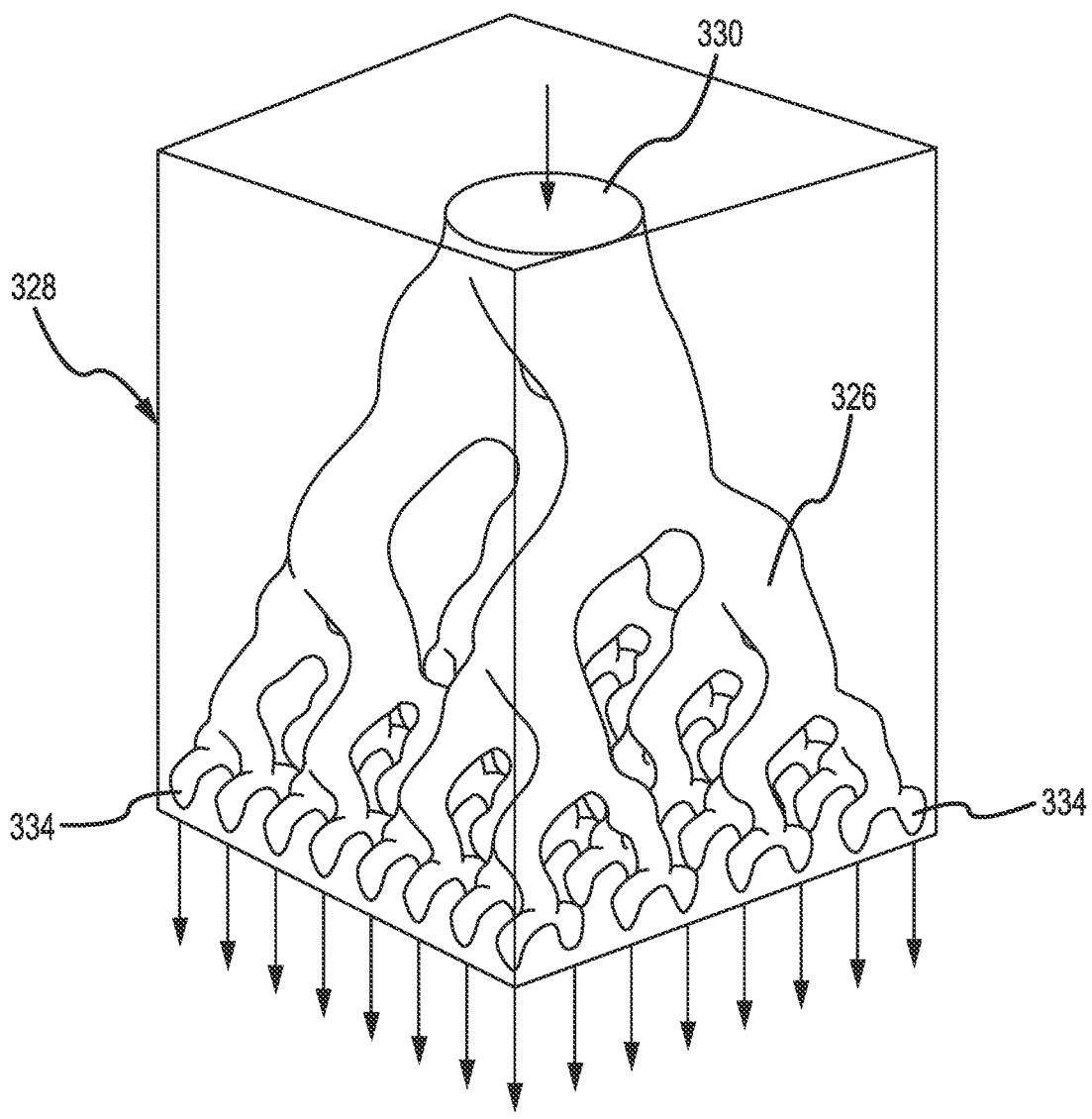
FIG. 10A is an isometric view of an exemplary fluid flow path within a distributor plate.

FIG. 10A illustrates an exemplary fluid flow 326 through a distributor plate or manifold 328 in an organic capillary/root splitting fashion where the flow path continuously and smoothly splits into pairs with the splitting being in an orthogonal direction to the previous split. The flow 326 path may be generated using topology optimization, and can be three-dimensional printed. In this instance, a single inlet 330 (for example) may be defined and a series of branches extend from the single inlet 330 in a non-rectilinear fashion. A large arrow indicates the flow of a single fluid into the inlet 330. The fluid flow 326 may exit the distributor plate or manifold 328 via a plurality of outlets 334 at the bottom thereof. Each of the outlets 334 show an arrow indicating the direction of travel of the fluid flowing from the distributor plate or manifold 328. The transitions between the branches are smooth, causing less of a pressure change than would otherwise occur. This type of manifold can be used to reduce pressure drop through the inlet and outlet manifold, which is especially true if the cooling fluid is a gas (e.g., air). Pressurizing gases requires more energy than pressurizing a liquid because the former is compressible. Topology optimization allows the least restrictive flow path to be designed, thus causing the majority of the pressure drop for the fluid to be from the impinging jets in between the outlet of the injection ports and the inlet of the extraction ports.

Figure 10B:
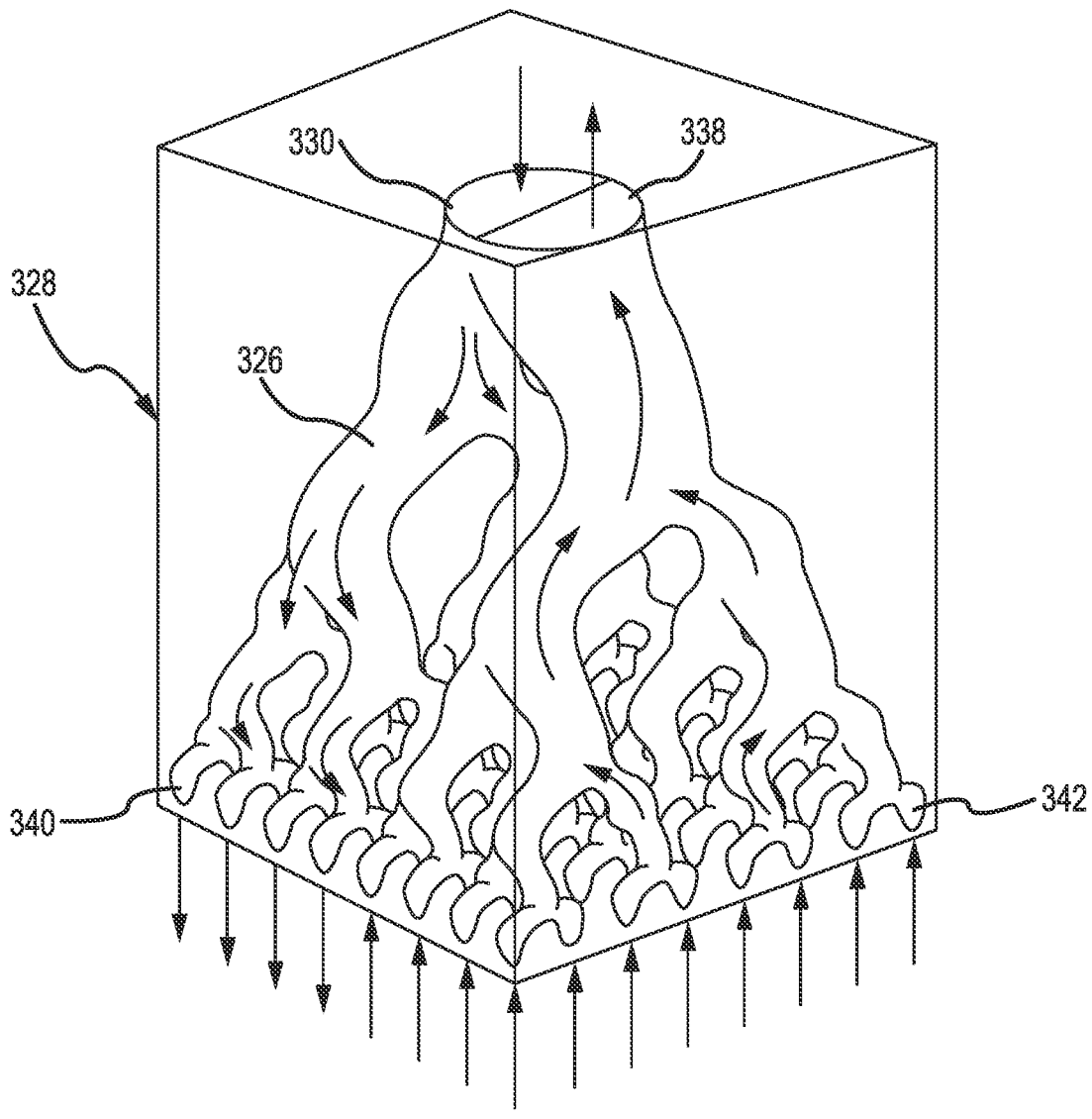
FIG. 10B is an isometric view of another exemplary fluid flow path within a distributor plate.

FIG. 10B illustrates an exemplary distributor plate or manifold 328 utilizing the organic capillary/root splitting with a single inlet port 330 and a single outlet port 338 at one end of the plate or manifold 328. In general, the fluid flow 326 in capillary/root splitting fashion is where the flow path continuously and smoothly splits into pairs with the splitting being in an orthogonal direction to the previous split. As indicated by the large arrow at the top of the plate or manifold 328, fluid 326 flows into the single inlet port 330, which is separated from the single outlet port 338. From the single inlet port 330, the fluid 326 is split numerous times in the capillary/root splitting fashion until it exits the bottom of the plate or manifold 328 via a plurality of injection ports 340 (indicated by the many arrows exiting the plate or manifold 328). At this point, the fluid may cool an object (e.g., IC) (not shown), and then return to the distributor plate or manifold 328 via a plurality of extraction ports 342

(indicated by the many arrows entering the plate or manifold 328) that consolidate the fluid into fewer and fewer flow paths until the fluid exits the plate or manifold 328 at the single outlet port 338, which is indicated by the single large arrow exiting the plate or manifold. Various modifications to the plate or manifold 328 may be made; the illustrations in FIGS. 10A and 10B are illustrative in nature and not intended to be limiting.

Figure 10C:
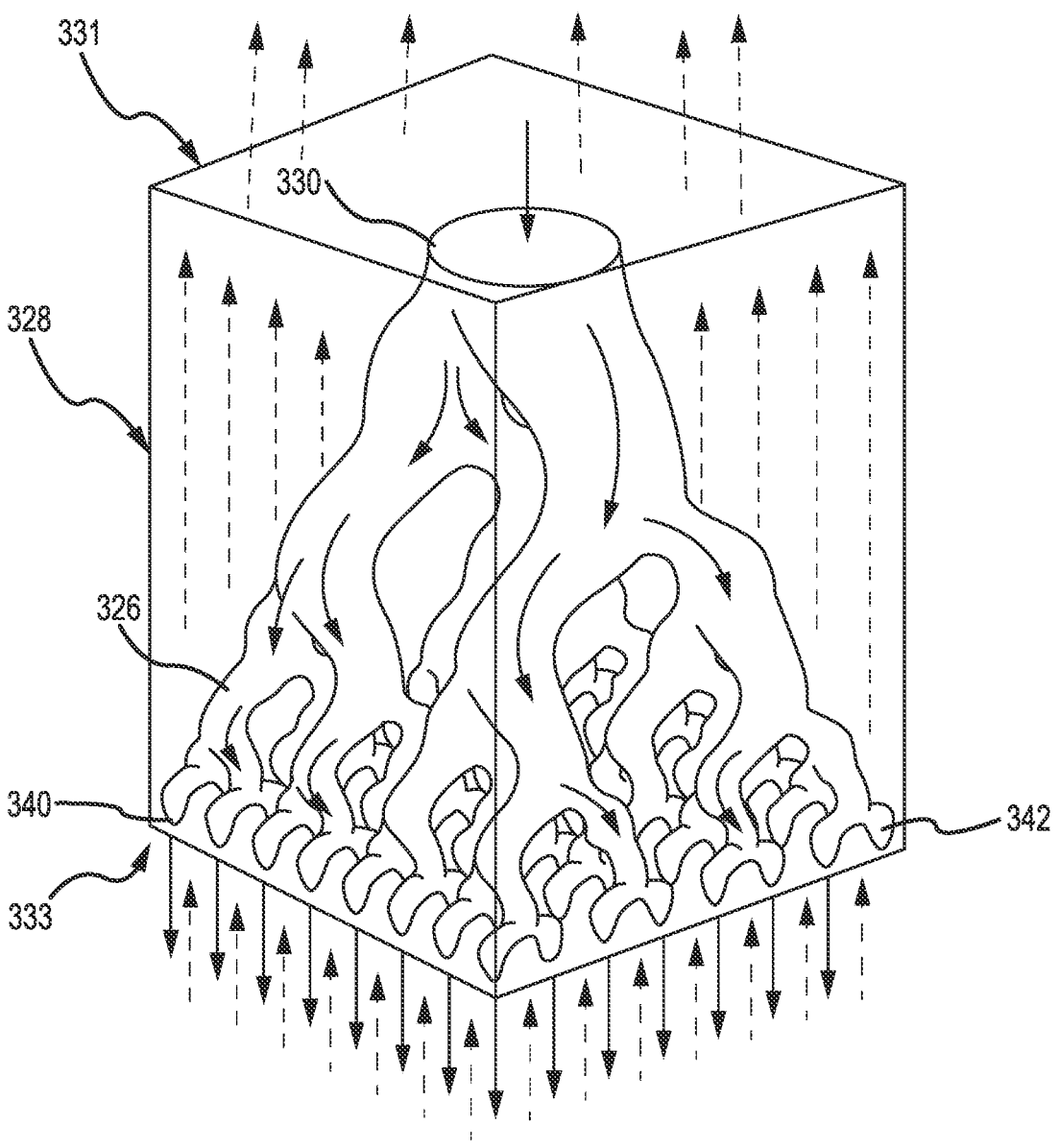
FIG. 10C is an isometric view of another exemplary fluid path within a distributor plate.

FIG. 10C illustrates another exemplary distributor plate or manifold 328 utilizing the organic capillary/root splitting with a single, inlet injection port 330 that at a first end 331 of the plate or manifold 328. In general, the fluid flow 326 in capillary/root splitting fashion is where the flow path continuously and smoothly splits into pairs with the splitting being in an orthogonal direction to the previous split. As indicated by the large arrow at the first end 331 of the plate or manifold 328, fluid 326 flows into the single inlet injection port 330. From the single inlet port 330, the fluid 326 is split numerous times via a capillary/root splitting structure (not shown in FIG. 10C, but understood to be a structure housing the fluid and generally conforming to the shape of the fluid 326 shown in FIG. 10C) until it exits the second end 333 of the plate or manifold 328 via a plurality of outlet, injection ports 340 (indicated by the many solid arrows exiting the plate or manifold 328). At this point, the fluid may cool an object (e.g., IC) (not shown), and then return to the distributor plate or manifold 328 via a plurality of inlet, extraction ports 342 (indicated by the many dotted arrows entering the plate or manifold 328). The inlet, extraction ports 342 are adjacent the outlet, injection ports 340, and occupy the negative space within the plate or manifold 328 that is not occupied by the capillary/root splitting structure. Once the fluid 326 enters the inlet, extraction ports 342, the fluid travels through the plate or manifold 328 towards the first end 331, and exits the plate or manifold 328 at the outlet, extraction ports 338 at the first end 331. In this way, the fluid 326 exiting the outlet, injection ports 340 is easily returned to the distributor plate or manifold 328 via the inlet, extraction ports 342 because the extraction ports 342 are intermingled with the injection ports 340 along the second end 333 of the plate or manifold 328. Various modifications to the plate or manifold 328 may be made; the illustrations in FIGS. 10A-10C are illustrative in nature and not intended to be limiting.

Figures 11A, 11B:
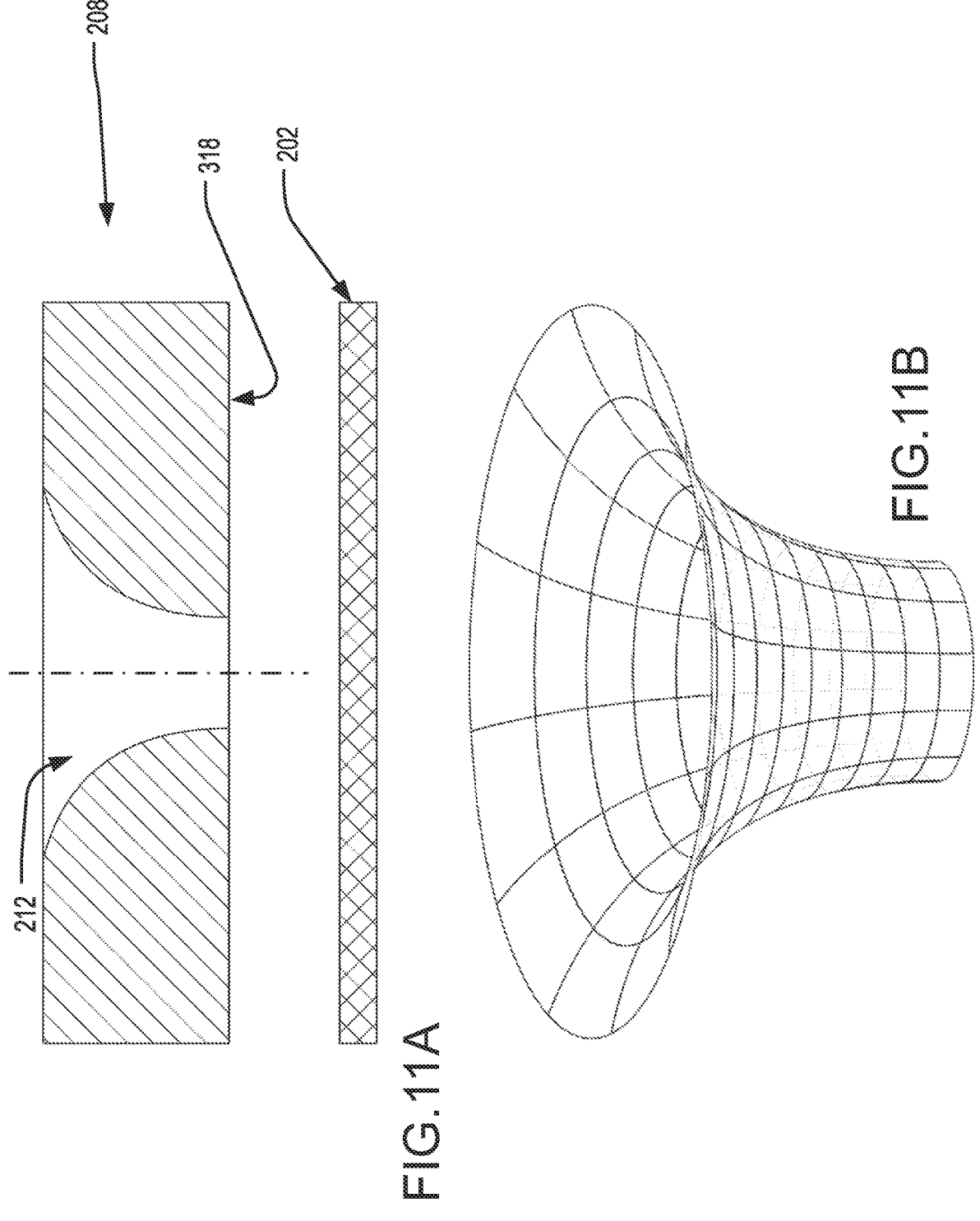
FIG. 11A is a cross-sectional side view of a distributor plate and a lid showing a nozzle geometry of an injection port.
FIG. 11B is an isometric view of an exemplary geometry of an injection or extraction port.

To further increase the rate of heat transfer from the object to the fluid, the geometries of the injection and extraction ports may be optimized. FIG. 11A illustrates a cross-sectional side view of a distributor plate 208, having an injection port 212, positioned adjacent an object 202. And FIG. 11B illustrates an isometric view of an exemplary hyperbolic funnel geometry that could be utilized for the ports 212, 214. As seen in FIG. 11A, the inner surfaces of the injection port 212 is rounded or non-linear. This is in contrast to a conical port which would have a sharp and rectilinear transition between the port and the bottom surface 318 of the plate 208. The hyperbolic funnel geometry has smoother transitions than conical or cylindrical ports, with reduced pressure drops. Reverse contour geometry is also possible. In all cases, the geometry of the inlet and extraction ports may be optimized with a shape different than a cone with a diameter that has a linear diameter change from the inlet to the outlet of the port.

Figure 12:
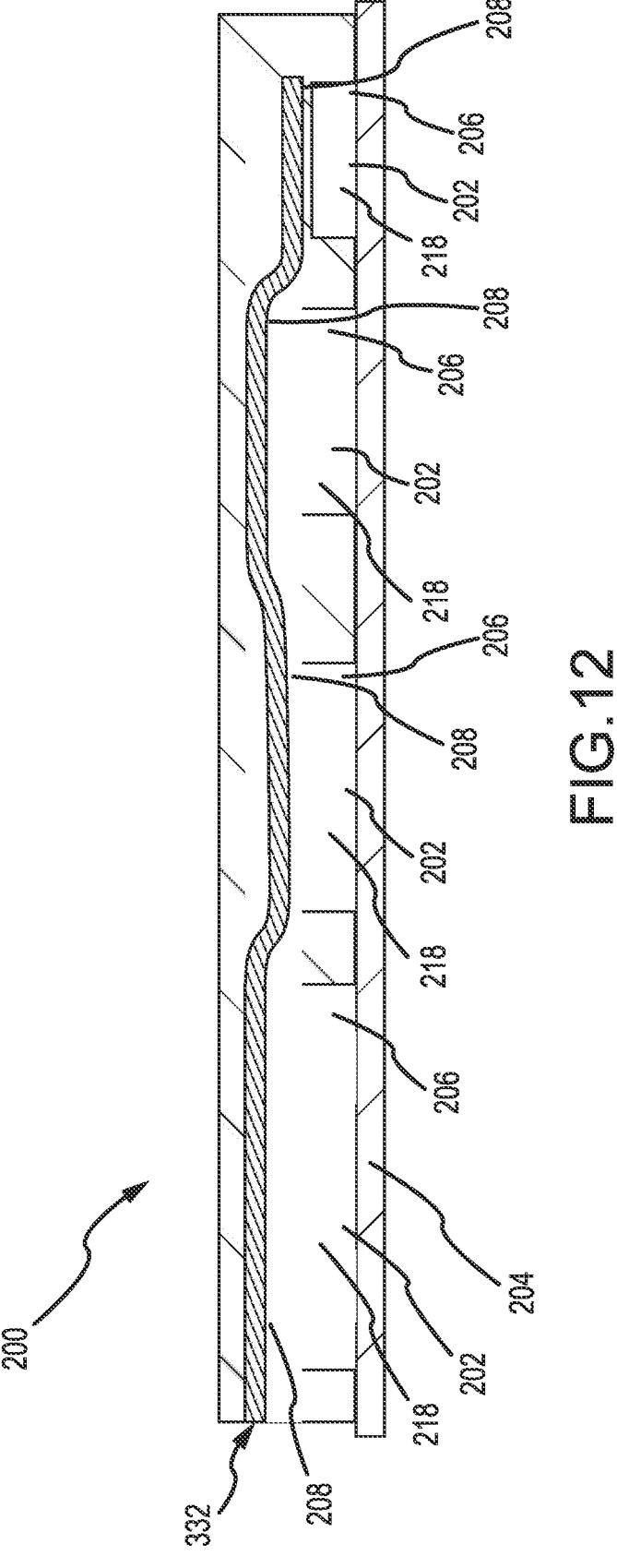
FIG. 12 is a cross-sectional side view of an exemplary jet impingement cooling device operable to provide cooling to multiple objects on a board.

In the case of a large board with multiple circuits in need of cooling, impingement cooling devices 200 may be designed with a single manifold that provides fluid flow to multiple distributor plates 208 for cooling multiple objects 202. To that end, reference is made to FIG. 12, which illustrates a cross-sectional side view of a jet impingement cooling device 200 cooling multiple objects 202 on a board 204. The inlet channel 332 (as well as the outlet channel(s) (not shown)) of the impingement device 200 may be custom contoured to the particular application so as to provide cooling fluid to multiple distributor plates 208 of the device 208. Each distributor plate 208 may provide cooling fluid to the lid 206 of its object 202. And the extraction ports (not shown) of the distributor plates 208 may provide a fluid path for the fluid to exit the device 200. The lids 206 may include surface features 220 to increase the rate of heat transfer as described herein. The manifold may be specifically designed to deliver a prescribed amount of cooling to each of the distributor plates 208.

Figure 13:
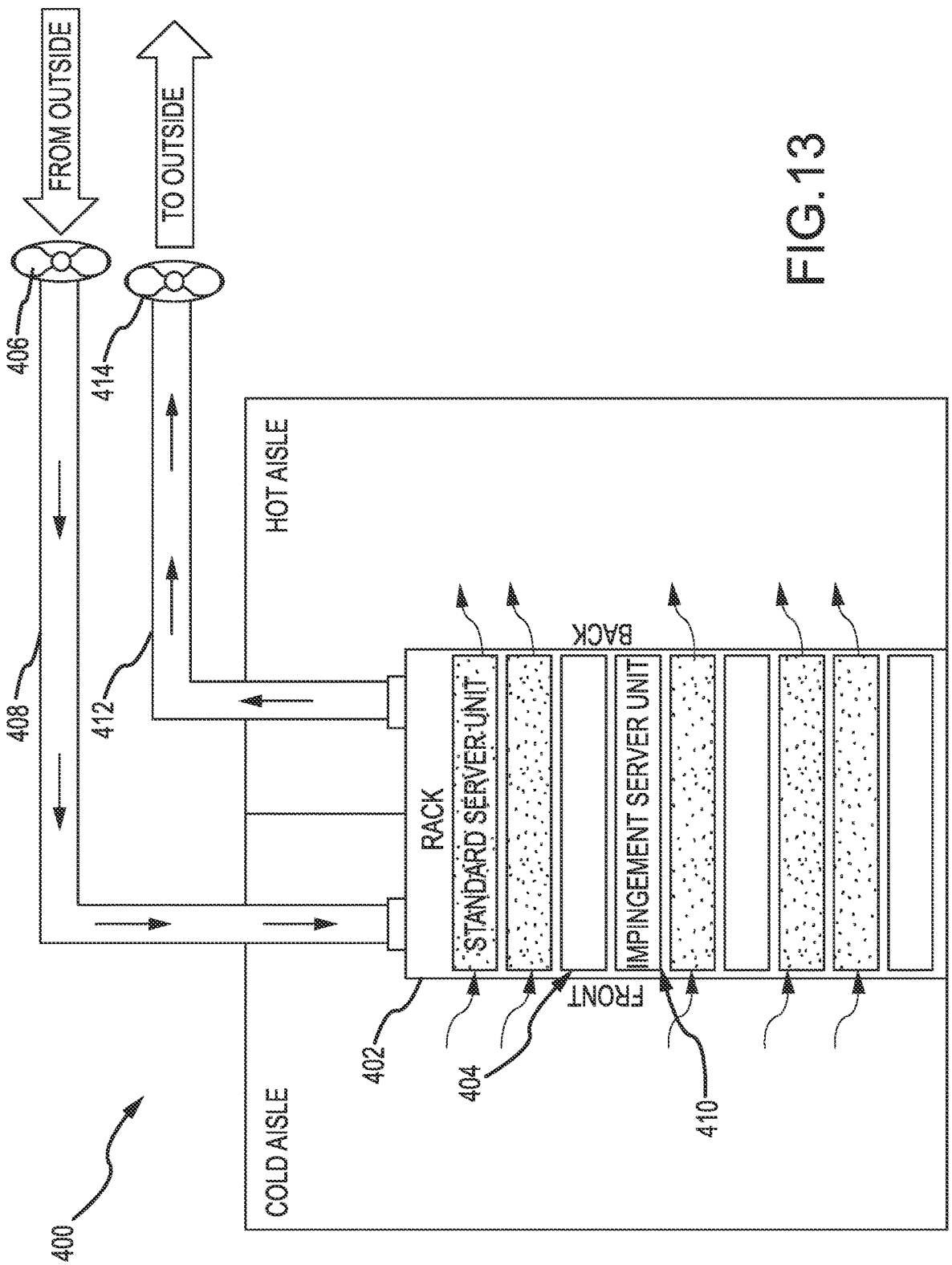
FIG. 13 is a diagrammatic view of a server rack including an impingement cooling unit connected to a duct system providing inflow and outflow of air to the unit.

FIG. 13 illustrates a diagrammatic view of an exemplary cooling system 400 integrated with a server rack 402 in order to cool units 404 within the rack 402. The system 400 includes an intake duct fan 406 blowing cool air from the outside into an intake duct 408. The intake duct 406 exits into an impingement unit 410 within the rack 402. It is noted that the air for the impingement system is contained/separate from the conditioned air that is used to generally cool the units via the cold aisle inlet and the hot aisle outlet. That is, the impingement cooling system 400 may operate with ambient, non-conditioned air, whereas the hot/cold aisle arrangement within a data center generally requires conditioned air.

Referring still to FIG. 13, the impingement unit 410 may include positive or negative air pumps, flow control systems (e.g., electronic proportional valve), and manifolding to supply air to the unit(s) 404 within the rack 402 in need of cooling. The individual impingement devices on the ICs may be any of the devices 200 described herein. The exhausted air from the extraction ports may exit the server rack 402 into an outlet duct 412, which is drive by an outlet duct fan 414.

Figure 14:
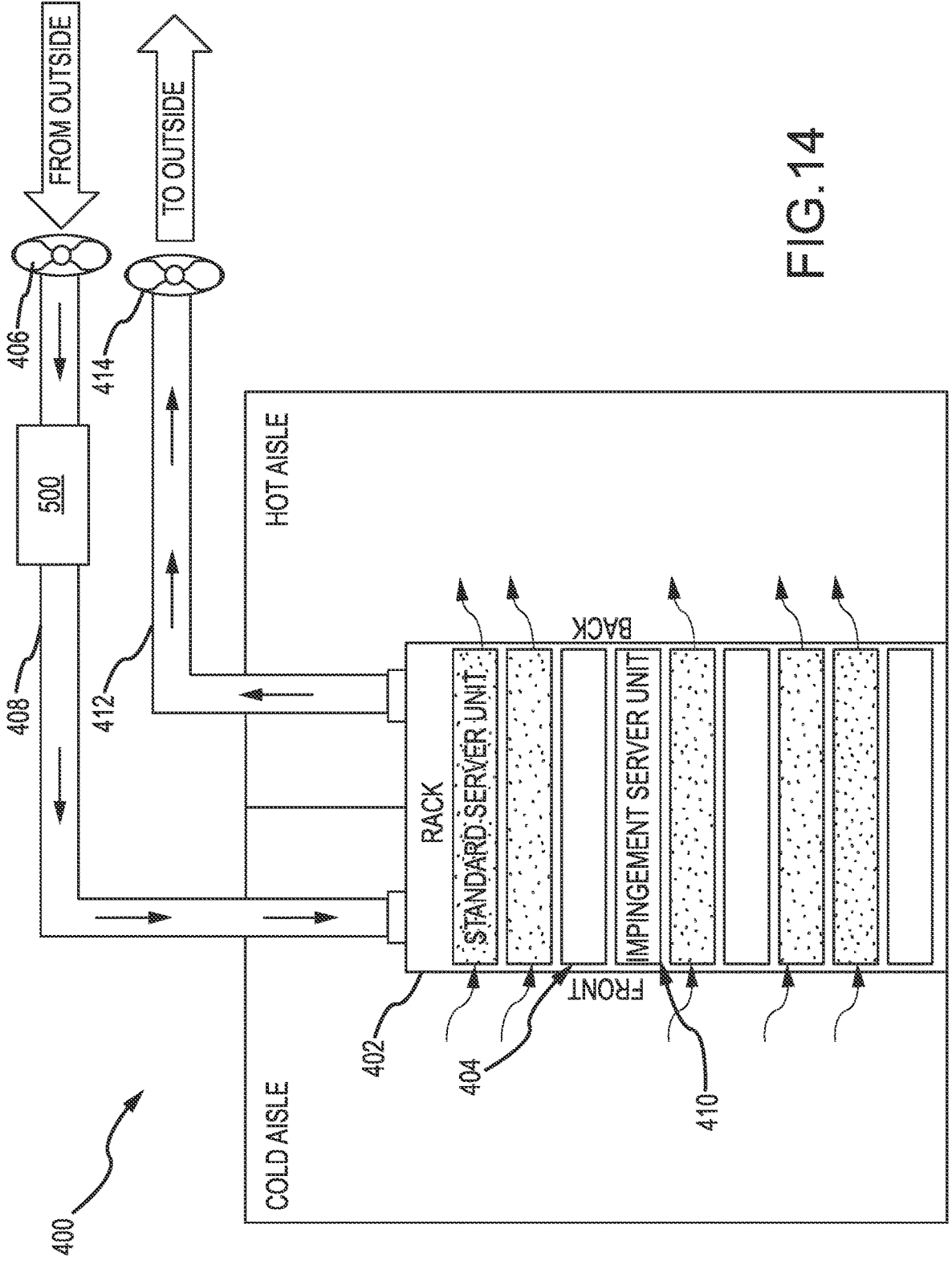
FIG. 14 is a diagrammatic view of a server rack including an impingement cooling unit connected to a duct system providing inflow and outflow of air to the unit, where the inflow of air if connected to a pre-cooling system.

In a certain instance, instead of the air coming into the inlet duct 408 directly from the outside, the air may be pre-cooled via a cooling system 500, as seen in FIG. 14, which is a diagrammatic view of an exemplary cooling system 400 integrated with a server rack 402 in order to cool units 404 within the rack 402. In certain instances, the air may be pre-heated to avoid freezing temperatures, for example. In other instances, the air may be conditioned by removing or adding humidity to the air. In certain instances, the air may be filtered. The precooling system 500 may be a chilled water loop, an evaporative cooling, indirect evaporative cooling, a dedicated vapor-compression system, a cold thermal storage depletion system, among others. The system 500 may be utilized when the outside air temperature is above or below a certain temperature threshold, or it may be utilized at all times.

Figure 15A:
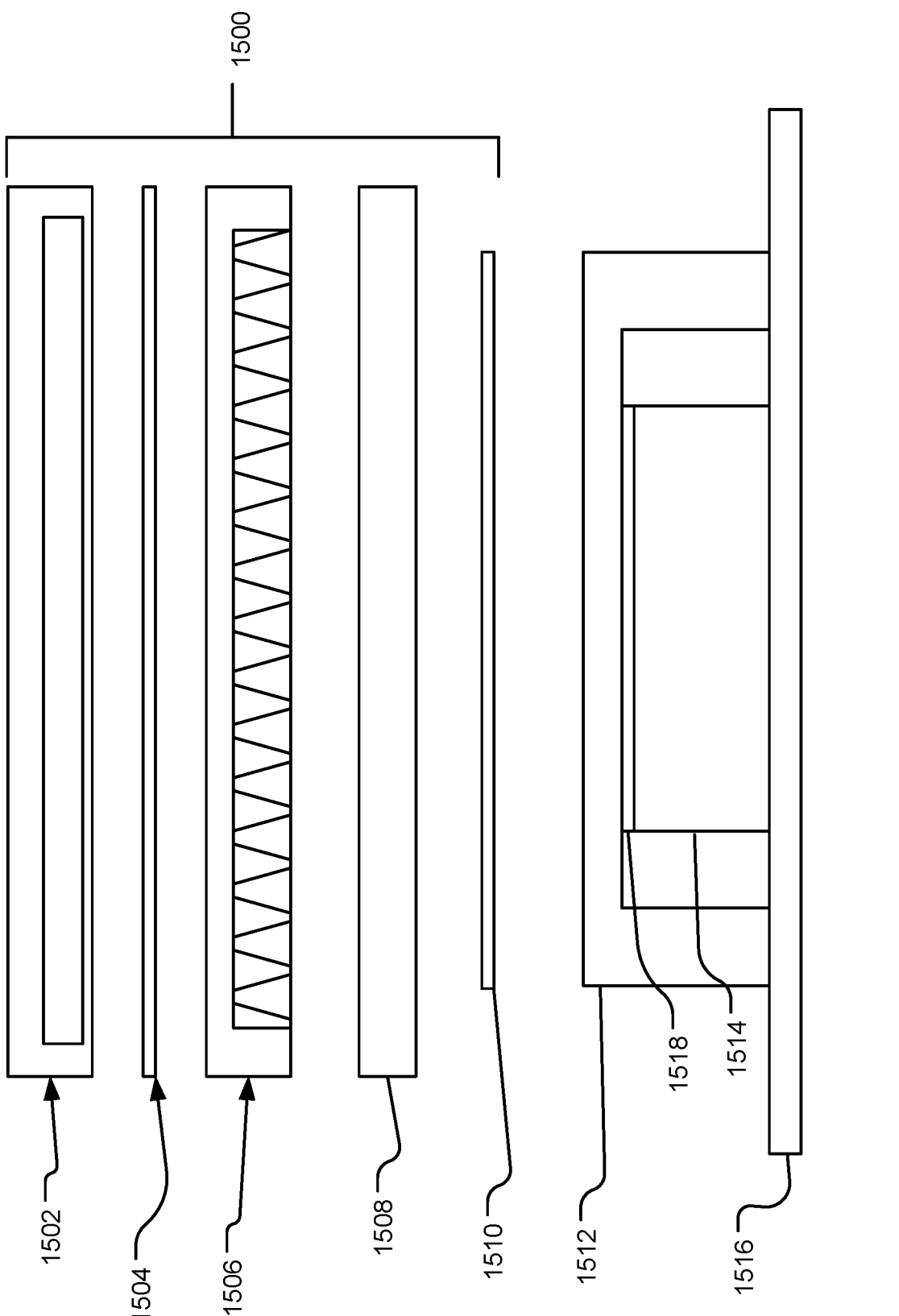
FIG. 15A is an exploded, cross-sectional side view of a jet impingement cooling device including a manifold, a first thermal interface material, a distributor plate, an impingement target, and a second thermal interface material. The jet impingement cooling device is positioned atop a lid that is atop an object on a board.

FIG. 15A is an exploded, cross-sectional side view of a jet impingement cooling device 1500 including a manifold 1502, a bonding material 1504, a distributor plate 1506 (may also be referred to as a distribution plate), an impingement target (also referred to as impingement plate) 1508, and a first thermal interface material (TIM) 1510. The jet impingement cooling device 1500 can be positioned atop a lid or heat spreader 1512 that is atop an object 1514 on a board 1516. There may be a second TIM 1518 positioned between the heat spreader 1512 and the object 1514. As described with reference to the previous figures, the object 1514 may be an IC such as an ASIC, or FPGA or another type of electronic device that produces heat and in need of cooling. The object 1514 is shown mounted to the board 1516, such as a PCB.

The jet impingement cooling device 1500 in this instance illustrates another way to enhance the heat transfer from an object 1514. In this instance, the jet impingement cooling device 1500 is modular and can be bonded to heat spreaders 1512 of various types and sizes via the first TIM 1510. This may be particularly useful in retrofitted applications where the jet impingement device 1500 is used to cool objects 1514 that already have a heat spreader 1512 attached thereto. In this way, an existing object 1514 and heat spreader 1512 may be retrofitted for additional cooling using the jet impingement cooling device 1500 by bonding the device 1500 to the heat spreader 1512 via the first TIM 1510.

In certain instances, such as seen in FIG. 15A, the use of an impingement target or plate 1508 permits cooling over a larger surface area as compared to a jet impingement device without an impingement target 1508. More specifically, the impingement target 1508 can be cooled over its entire top surface while being bonded to a heat spreader 1512 that is of a smaller surface area, as seen in FIG. 15A. Therefore, the cooling effect is increased as compared with using an impingement target 1508 of the same surface are as the heat spreader 1512 with all other factors being equal. Without an impingement target 1508, there would be little advantage to increasing the surface area of the distributor plate 1506 so as to extend laterally over the heat spreader 1512.

Figure 15B:
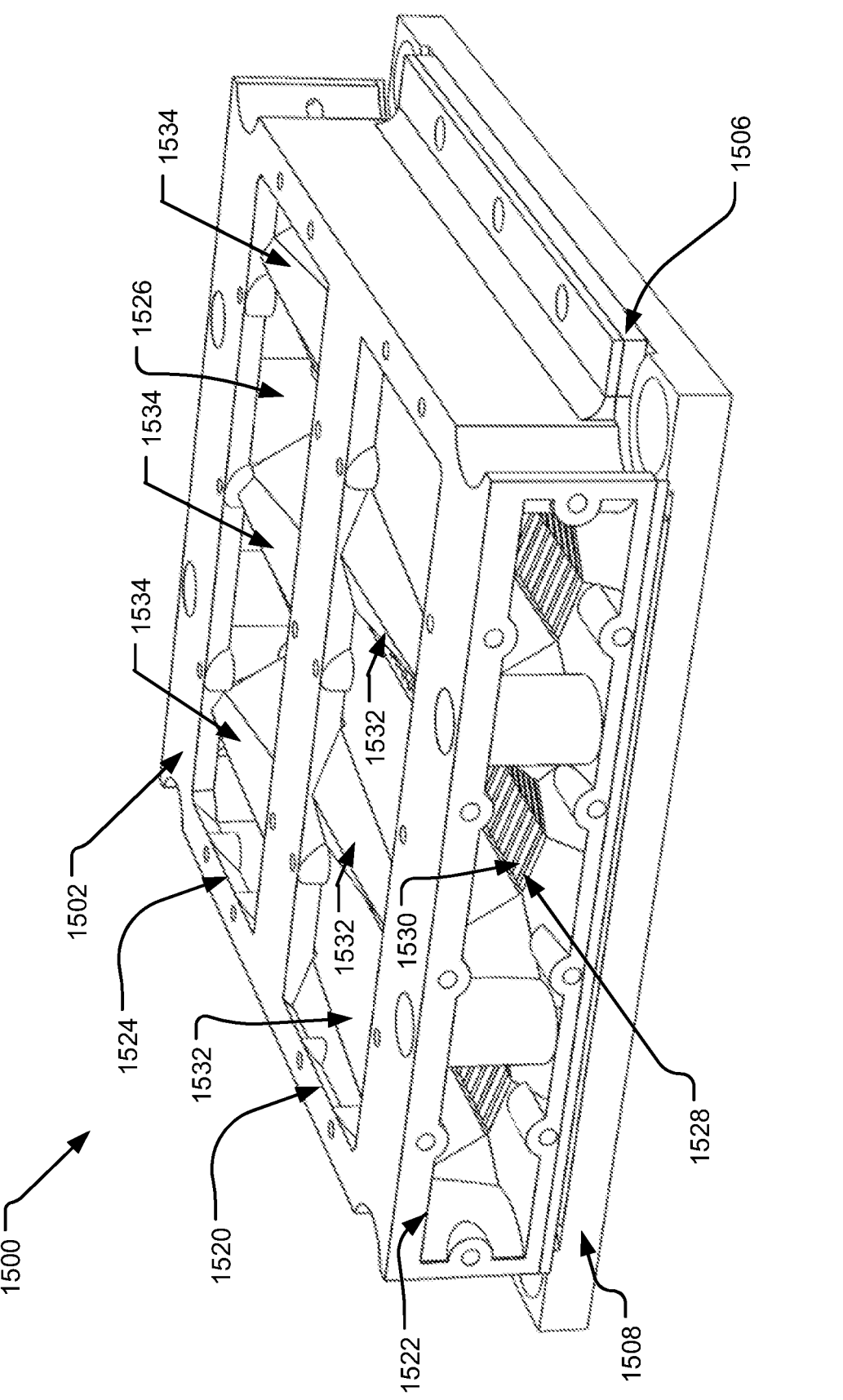
FIG. 15B is an isometric view of a jet impingement cooling device including a configurable manifold, a distributor plate, and an impingement target.

FIG. 15B is an isometric view of an exemplary jet impingement cooling device 1500 according to the device shown and described with reference to FIG. 15A. The device 1500 in FIG. 15B may include a configurable manifold 1502, a distributor plate 1506, and an impingement target 1508. In certain instances, there may be a bonding material 1504 positioned between the manifold 1502 and the distributor plate 1506. The bonding material 1504 may provide a mechanical/fluidic connection between the distributor plate 1506 and the manifold 1502. This connection can be made by bonding the two components together via an adhesive, chemical weld, or the like, by mechanical compression whereby the two components are pressed together. In certain instances, a gasket material may be utilized. Alternatively, the manifold 1502 and the distributor plate 1506 may be unitarily constructed as a single structure (e.g., 3D printed as a unitary part). In such a case, there would be no bonding material 1504. There may also be a TIM on the bottom surface of the impingement target 1508 (not shown in FIG. 15B).

As seen in FIG. 15B, the manifold 1502 is a rectangular box-like structure or enclosure having configurable inflow and outflow openings. More particular the manifold 1502 includes a top inflow opening 1520, a side inflow opening 1522, a top outflow opening 1524 adjacent the top inflow opening 1520, and a side outflow opening 1526 that is opposite of the side inflow opening 1522. The top inflow and outflow openings 1520, 1524 are on a top side of the manifold 1520. The bottom side of the manifold is shown in FIG. 16.

The top inflow opening 1520 and side inflow opening 1522 are on an inflow side of the manifold 1502 and lead to an internal inflow volume of the manifold 1502. And, the top outflow opening 1524 and side outflow opening 1526 are on an outflow side of the manifold 1502 and lead to an internal outflow volume of the manifold 1502. Within the internal inflow volume of the manifold 1502 there are a series of vertically oriented walls 1528 that are equally spaced apart and are positioned from the side inflow opening 1522 to the side outflow opening 1526. In between pairs of walls 1528 are channels or openings 1530 that permit fluid flow there between. The channels 1530 lead to injection ports in the distributor plate 1506, whereas the walls 1528 block off the extraction ports in the distributor plate 1506. Within the internal inflow volume, there are outflow enclosures 1532 that contain outflowing fluid and that prevent fluid flow from the internal inflow volume from entering. Similarly, there are inflow enclosures 1534 on the outflow side of the manifold 1502. The inflow enclosures 1534 prevent outflow fluid from mixing with the inflow fluid.

Figure 16:
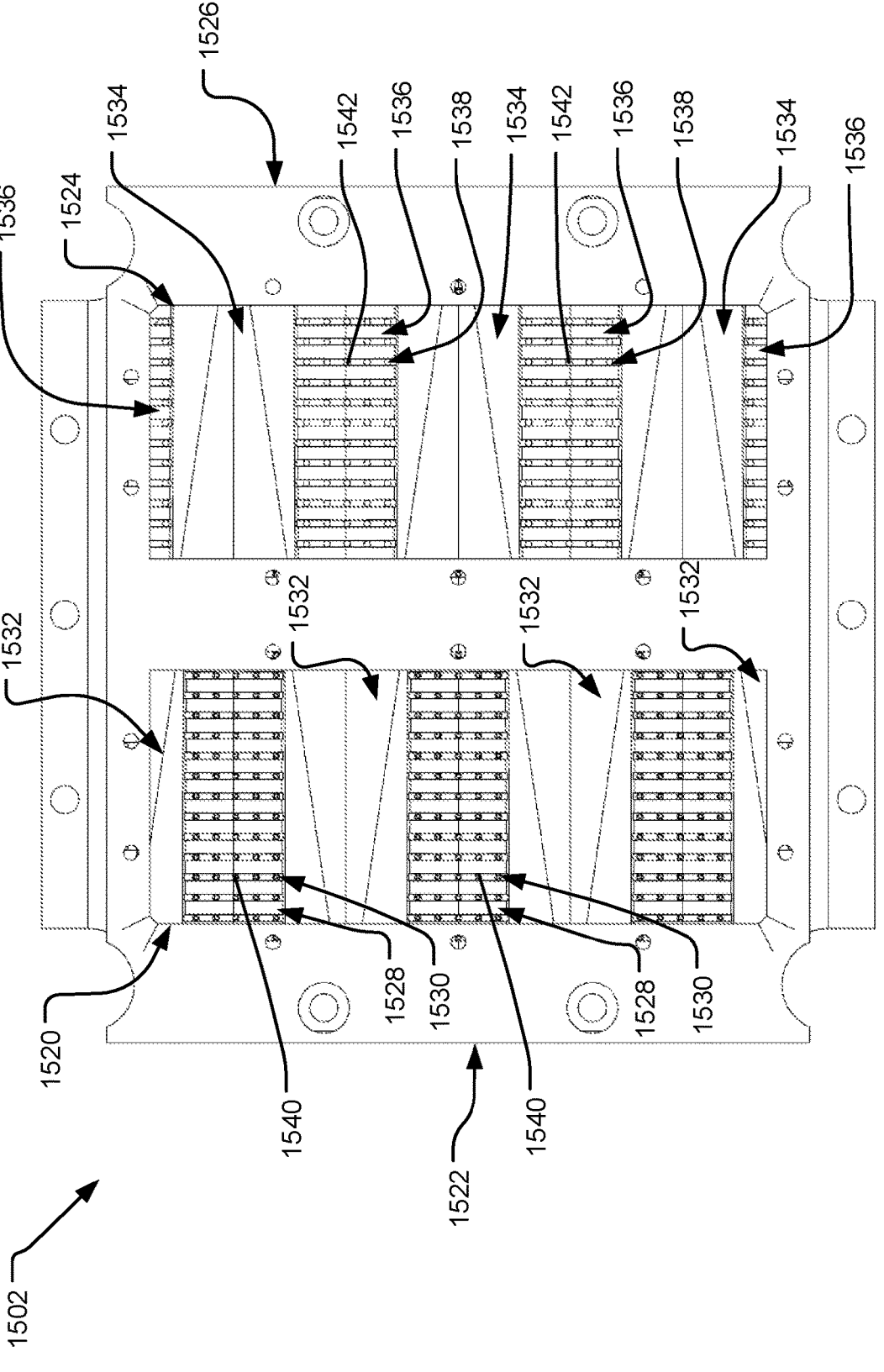
FIG. 16 is a top view of the manifold of the jet impingement cooling device of FIG. 15B.

As best seen in FIG. 16, which is a top view of the manifold 1502 of the jet impingement cooling device 1500, within the internal outflow volume of the manifold 1502, on the outflow side of the manifold 1502 (right side), there are a series of vertically oriented walls 1536 that are equally spaced apart and are positioned from the side inflow opening 1522 to the side outflow opening 1526. In between pairs of walls 1536 are channels or openings 1538 that permit fluid flow there between. The channels 1538 lead to extraction ports in the distributor plate 1506, whereas the walls 1528 block off the injection ports in the distributor plate 1506. From the top view of FIG. 16, it can be seen how the fluid that flows into the internal inflow volume enters the channels 1530, which extend to the outflow side of the manifold 1502 via the inflow enclosures 1534. The fluid flows through the channels 1530 and into the injection ports 1540 of the distributor plate 1506, absorbs heat from the impingement target, and flows back through the extraction ports 1542 of the distributor plate 1506, which lead through the channels 1538 in between the pairs of walls 1536 and into the internal outflow volume of the manifold 1502, which extends to the inflow side of the manifold 1502 via the outflow enclosures 1532. The injection ports 1540 may be non-linear nozzles as shown and described with reference to FIGS. 11A-11B.

Figure 17:
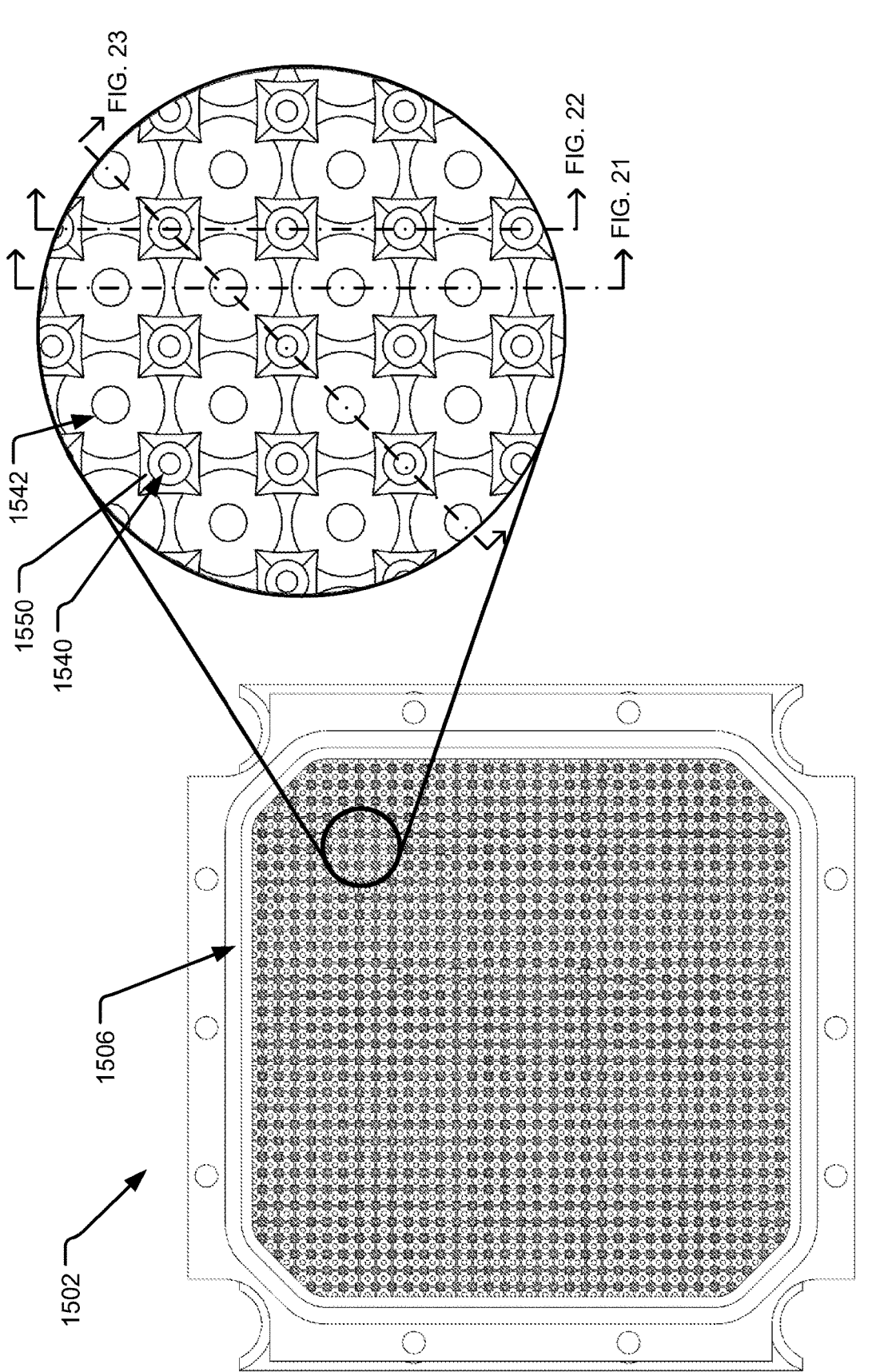
FIG. 17 is a bottom view of the manifold of the jet impingement cooling device of FIG. 15B.

FIG. 17 is a bottom view of the manifold 1502 and the distributor plate 1506 of the jet impingement cooling device 1500. FIG. 17 includes a close-up of the bottom surface of the distributor plate 1506 showing the arrangement of injection ports 1540 and extraction ports 1542. As seen in FIG. 17, the injection ports 1540 are openings formed in a post or pin 1550, which may include four side surfaces, among other structural configurations. The extraction ports 1542 have the largest diameter at the bottom surface of the distributor plate 1506, and the smallest diameter at the top surface of the distributor plate 1506. The injection ports 1540 and extraction ports 1542 are arranged linearly in an alternating fashion. That is, the injection ports 1540 and extraction ports 1542 are offset from each other.

Figure 18:
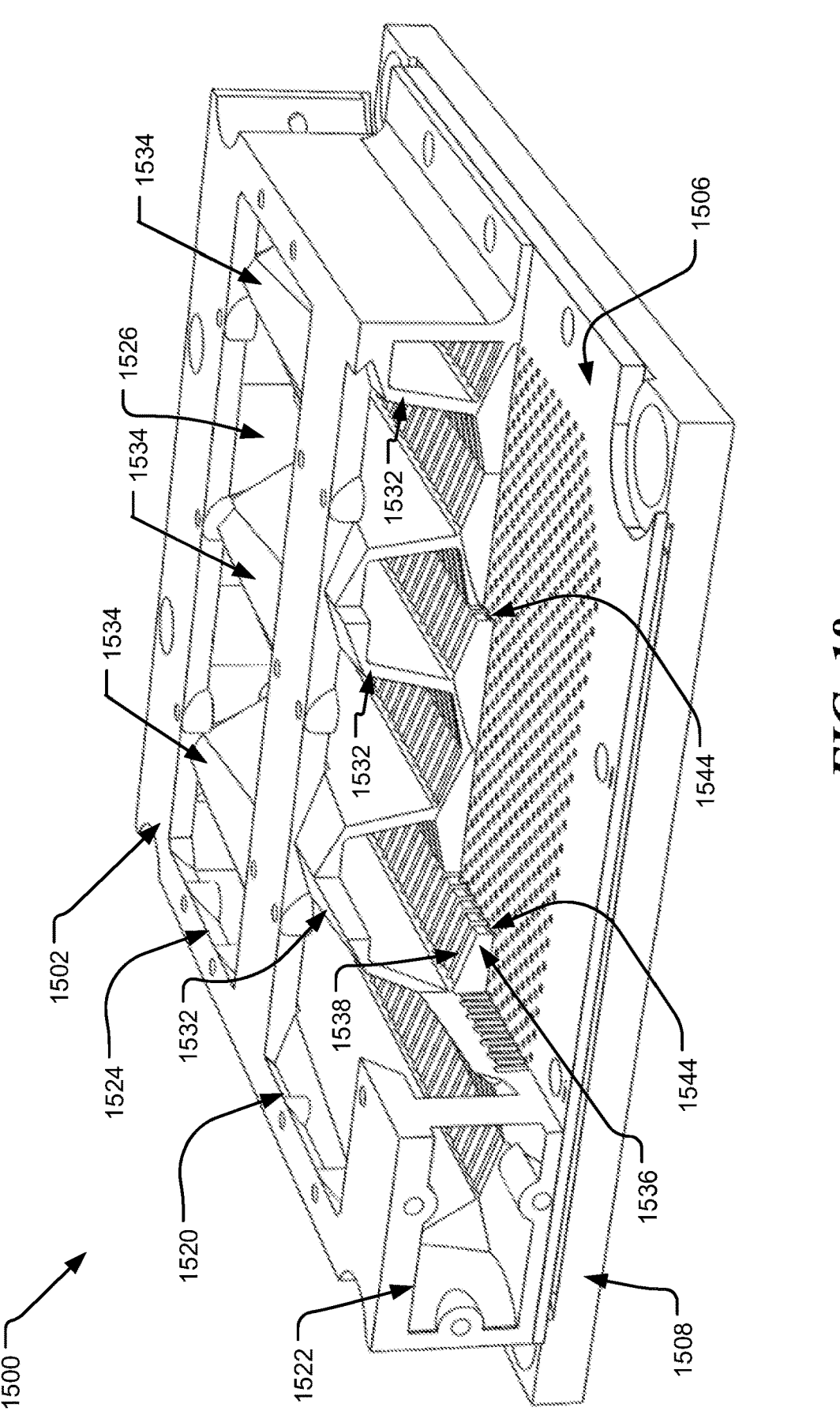
FIG. 18 is an isometric view of the jet impingement cooling device of FIG. 15B shown with the manifold in a partial cross-section.

FIG. 18 is an isometric view of the jet impingement cooling device 1500 with the manifold 1502 in a partial cross-section. As seen in the figure, the outflow enclosures 1532, which extend into the internal inflow volume of the manifold 1502, are shown in partial cross-section. While discrete sections of the manifold 1502 are utilized for either inflow or outflow of a fluid, fluid flow can still reach all of the appropriate ports (injection or extraction) in the distributor plate 1506. For instance, fluid flow may reach the injection ports of the distributor plate 1506 in a position underneath the walls 1536 within the internal outflow volume of the manifold 1502 via channels 1544 formed on the bottom side of the walls 1536. Thus, the walls 1536 extend down to the distributor plate 1506 and block the outflowing fluid exiting the extraction ports from entering the injection ports, and the walls 1536 also permit the incoming flow of fluid within the channels 1544 to reach the injection ports of the distributor plate 1506.

Similarly, the walls 1528 within the internal inflow volume of the manifold 1502 include channels (not seen in FIG. 18) on a bottom side thereof that permit the flow of outgoing fluid from the extraction ports in the distributor plate 1506. The channels permit the flow of fluid to the internal outflow volume of the manifold 1502.

Figure 19:
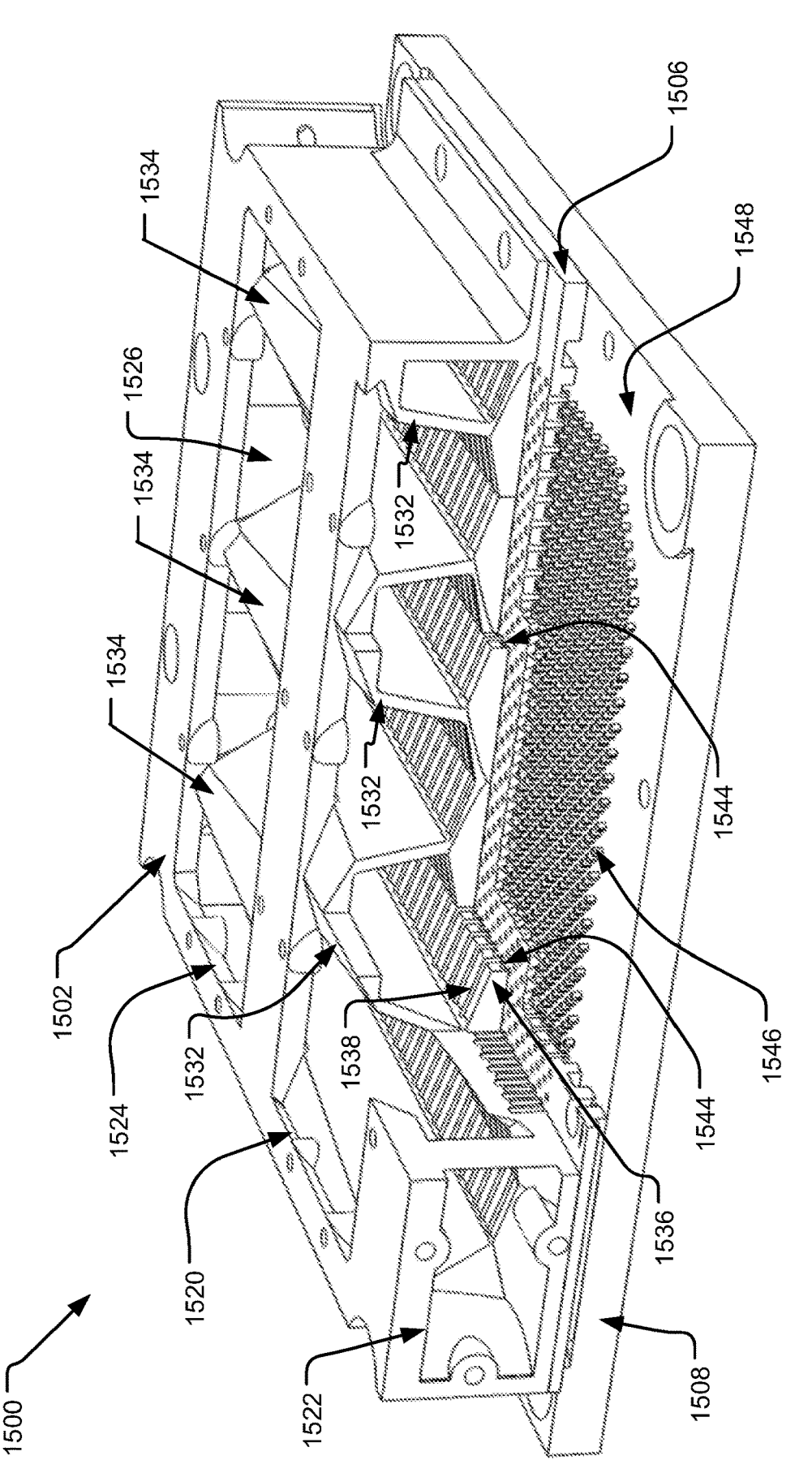
FIG. 19 is an isometric view of the jet impingement cooling device of FIG. 15B shown with the manifold and the distributor plate in a partial cross-section, which exposes the surface enhancements of the impingement target.
Figure 20:
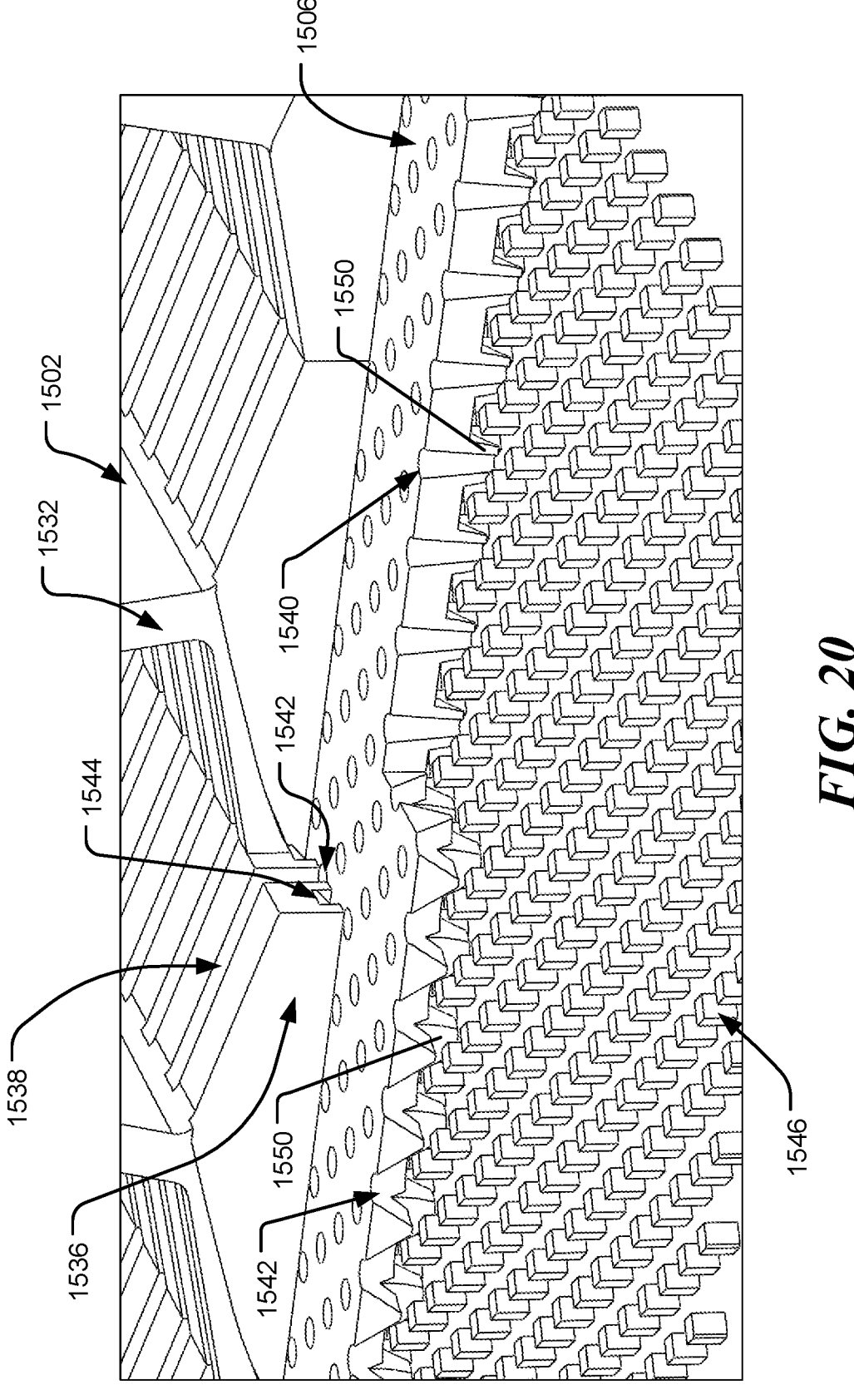
FIG. 20 is a close-up view of FIG. 19 showing the distributor plate positioned atop the impingement target.

FIG. 19 is an isometric view of the jet impingement cooling device 1500 with the manifold 1502 and the distributor plate 1506 in a partial cross-section. As seen in the figure, the impingement target 1508 includes surface enhancements 1546 in the form of a series of protrusions extending upwards from the planar top surface 1548. FIG. 20 is a close-up view of FIG. 19 showing the distributor plate 1506 positioned atop the impingement target 1508. As seen in FIG. 20, the injection ports 1540 on the distributor plate 1506 are formed within a pin 1550 that projects downward towards the planar top surface 1548 of the distributor plate 1506. The pins 1550 are positioned in between the raised surface protrusions 1546 of the distributor plate 1506. Stated differently, the injection ports 1540 extend below the primary plane of the distributor plate 1506. This allows for the jet orifices to be positioned closer to the target surface 1548 while still allowing for raised surface protrusions 1546 on the target surface 1548. Placing the jet orifices of the injection ports 1540 closer to the target surface 1548 enhances the heat transfer coefficient. Increasing the height of the protrusions 1546 increases heat transfer area and thus the overall heat transfer performance. The area enhancement structures (e.g., protrusions) and the "drop jets" are nested so as to not interfere with one another.

As seen in FIG. 20, the injection ports 1540 are nozzles with a larger cross-sectional area at the top of the distributor plate 1506 and a smaller cross-sectional area at the bottom of the distributor plate 1506. The extraction ports 1542 also operate as nozzles with the larger cross-sectional area at the bottom of the distributor plate 1506 and a smaller cross-sectional area at the top of the distributor plate 1506. The extraction ports 1542 are not formed on pins or posts that extend below the surface area enhancements 1546. It is noted that FIG. 20 illustrates the channel 1544 formed on the bottom of the wall 1536. Pairs of walls 1536 form channels 1538 there between that permit fluid flow out of the extraction ports 1542 and into the internal outflow volume of the manifold 1502. The channel 1544 formed in the bottom of the wall 1536, as seen in FIG. 20, is positioned atop the injection ports 1540. The channel 1544 permits fluid flow from the adjacent internal inflow volume of the manifold 1502 to flow to the injection ports 1540 that are beneath the walls 1536.

Figure 21:
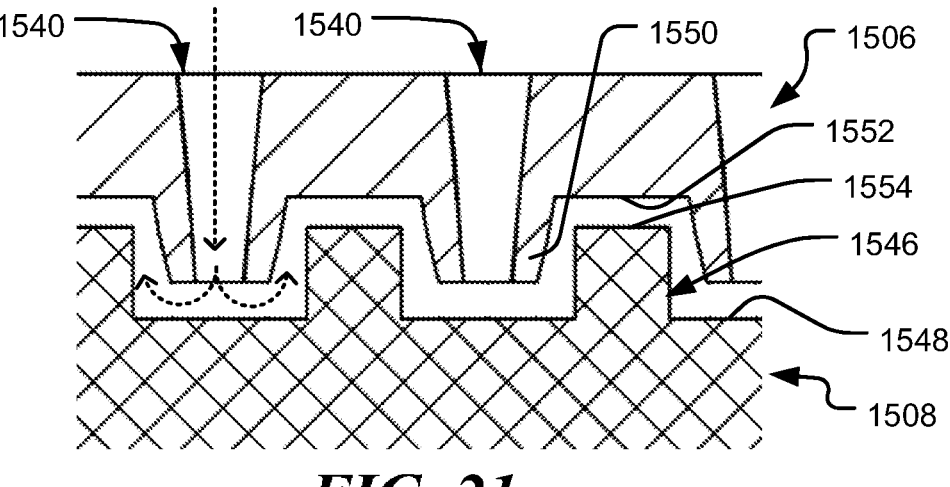
FIG. 21 is a close-up, side cross-sectional view of the injection ports of the distributor plate opposing the surface enhancements of the impingement target.
Figure 22:
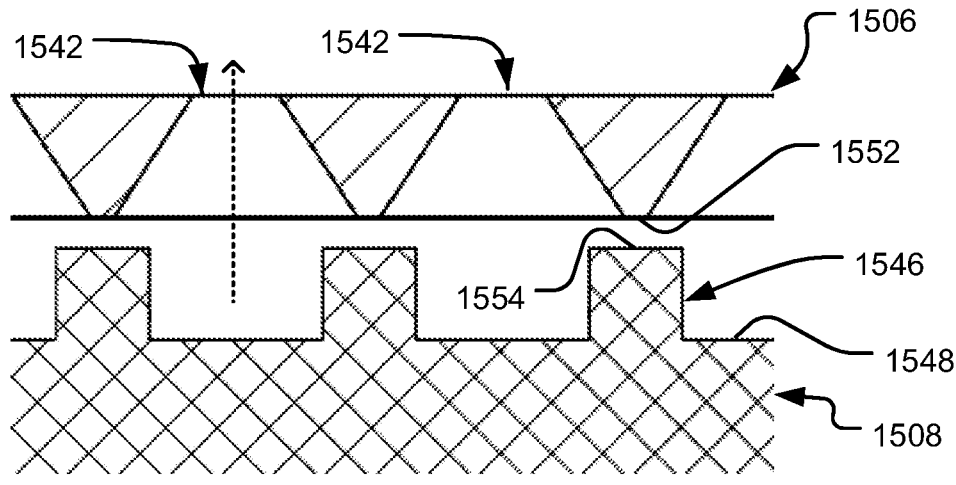
FIG. 22 is a close-up, side cross-sectional view of the extraction ports of the distributor plate opposing the surface enhancements of the impingement target.
Figure 23:
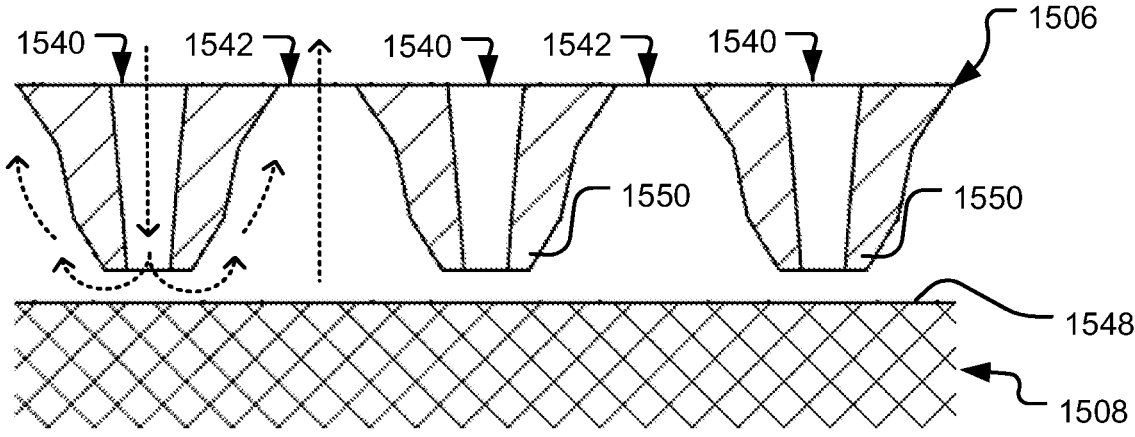
FIG. 23 is a close-up, side cross-sectional view of the injection ports and the extraction ports 542 opposing the impingement target.

FIGS. 21-23 depict various cross sections of the distributor plate 1506 and the impingement target 1508. The cross-section lines are depicted in the close-up image of FIG. 17. FIG. 21 is a close-up, side cross-sectional view of the injection ports 1540 of the distributor plate 1506 opposing the surface enhancements 1546 of the impingement target 1508. FIG. 22 is a close-up, side cross-sectional view of the extraction ports 1542 of the distributor plate 1506 opposing the surface enhancements 1546 of the impingement target 1508. And FIG. 23 is a close-up, side cross-sectional view of the injection ports 1540 and the extraction ports 1542 opposing the impingement target 1508.

As seen in FIG. 21, the injection ports 1540 are conical with a larger circumference at the top and a smaller circumference at the bottom (i.e., nearest the impingement target 1508). A bottom surface 1552 of the distributor plate 1506 oppose the top surfaces 1554 of the surface enhancements 1546 of the impingement target 1508, and the posts 1550 of the distributor plate 1506 extend downward from the bottom surface 1552 of the distributor plate 1506 so that the lower opening of the injection ports 1540 oppose the planar top surface 1548 of the distributor plate 1506 to which the surface enhancements 1546 extend upwards therefrom. That is, the injection ports 1540 are offset from the upwardly extending or raised surface enhancements 1546 of the impingement target 1508. The direction of fluid flow is shown in dotted lines on the left-most injection port 1540.

As seen in FIG. 22, the extraction ports 1542 are conical in shape with a smaller circumference at the top and a larger circumference at the bottom (i.e., nearest the impingement target 1508). The lower openings of the extraction ports 1542 oppose the planar top surface 1548 of the distributor plate 1506, and the surface enhancements 1546 are offset or positioned between the extraction ports 1542. The direction of fluid flow is shown in dotted lines on the left-most extraction port 1542.

As seen in FIG. 23, the cross-section includes both extraction ports 1542 and injection ports 1540. Along this particular cross-section (diagonally along the distributor plate 1506 as seen in FIG. 17), no surface enhancements 1546 on the impingement target 1508 can be seen. Instead, the cross-section traverses the planar top surface of the impingement target 1508. As seen in the figure, the post 1550 includes linear sections as it tapers downward. The direction of fluid flow is shown in dotted lines on the left-most injection port 1540 and extraction port 1542.

FIGS. 24-27 are isometric views of the manifold 1502 showing different exemplary inflow and outflow configurations. As stated previously, the manifold 1502 is configurable given the fluid inflow can be provided by one or both of the top inflow opening 1520, and the side inflow opening 1522. Similarly, the fluid outflow can be provided one or both of the top outflow opening 1524, and the side outflow opening 1526 that is opposite of the side inflow opening 1522. To facilitate the use of a particular opening for fluid flow, a header (not shown) may be secured to an opening. To block the fluid flow through an opening, a cover plate 1556 may be secured, fastened, or manufactured into the manifold 1502. Side cover plates 1556s may be used to block fluid flow from entering or exiting the side inflow opening 1522 and the side outflow opening 1522. Top cover plates 1556t may be used to block fluid flow from entering or exiting the top inflow opening 1520 and top outflow opening 1524.

Figures 24, 25, 26, 27:
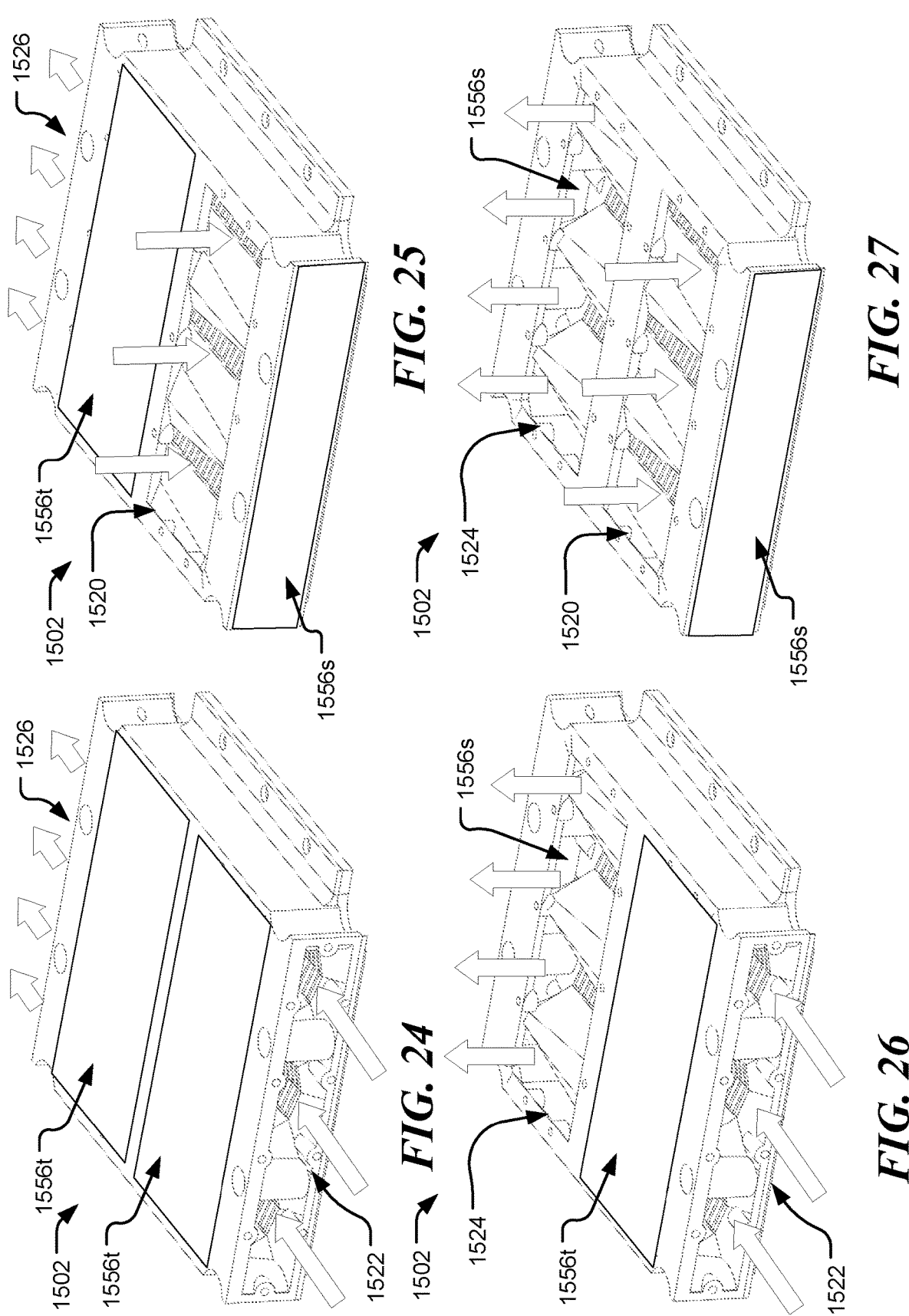
FIGS. 24-27 are isometric views of the manifold showing different exemplary inflow and outflow configurations.

As seen in FIG. 24, fluid inflow is provided through the side inflow opening 1522, and fluid outflow is provided through the side outflow opening 1526. The top openings are blocked via the top cover plates 1556t. As seen in FIG. 25, fluid inflow is provided through top inflow opening 1520, and fluid outflow is provided through side outflow opening 1526. The top outflow opening is blocked via a top cover plate 1556t, and the side inflow opening is blocked via a side cover plate 1556s. As seen in FIG. 26, fluid inflow is provided through the side inflow opening 1522, and fluid outflow is provided through the top outflow opening 1524. The top inflow opening is blocked via a top cover plate 1556t, and the side outflow opening is blocked via a side cover plate 1556s. And as seen in FIG. 27, fluid inflow is provided through the top inflow opening 1520, and fluid outflow is provided through the top outflow opening 1524. The side inflow and outflow openings are blocked via a pair of side cover plates 1556s.

Alternative configurations of the manifold, which are not shown, are the following: the fluid inflow being provided by the top inflow opening 1520 and the side inflow opening 1522, and the fluid outflow being provided by the top outflow opening 1524 and the side outflow opening 1526; the fluid inflow being provided the top inflow opening 1520, and the fluid outflow being provided by the top outflow opening 1524 and the side outflow opening 1526; the fluid inflow being provided the side inflow opening 1522, and the fluid outflow being provided by the top outflow opening 1524 and the side outflow opening 1526; the fluid inflow being provided by the top inflow opening 1520 and the side inflow opening 1522, and the fluid outflow being provided by the top outflow opening 1524; and, the fluid inflow being provided by the top inflow opening 1520 and the side inflow opening 1522, and the fluid outflow being provided by the side outflow opening 1526.

Figure 28:
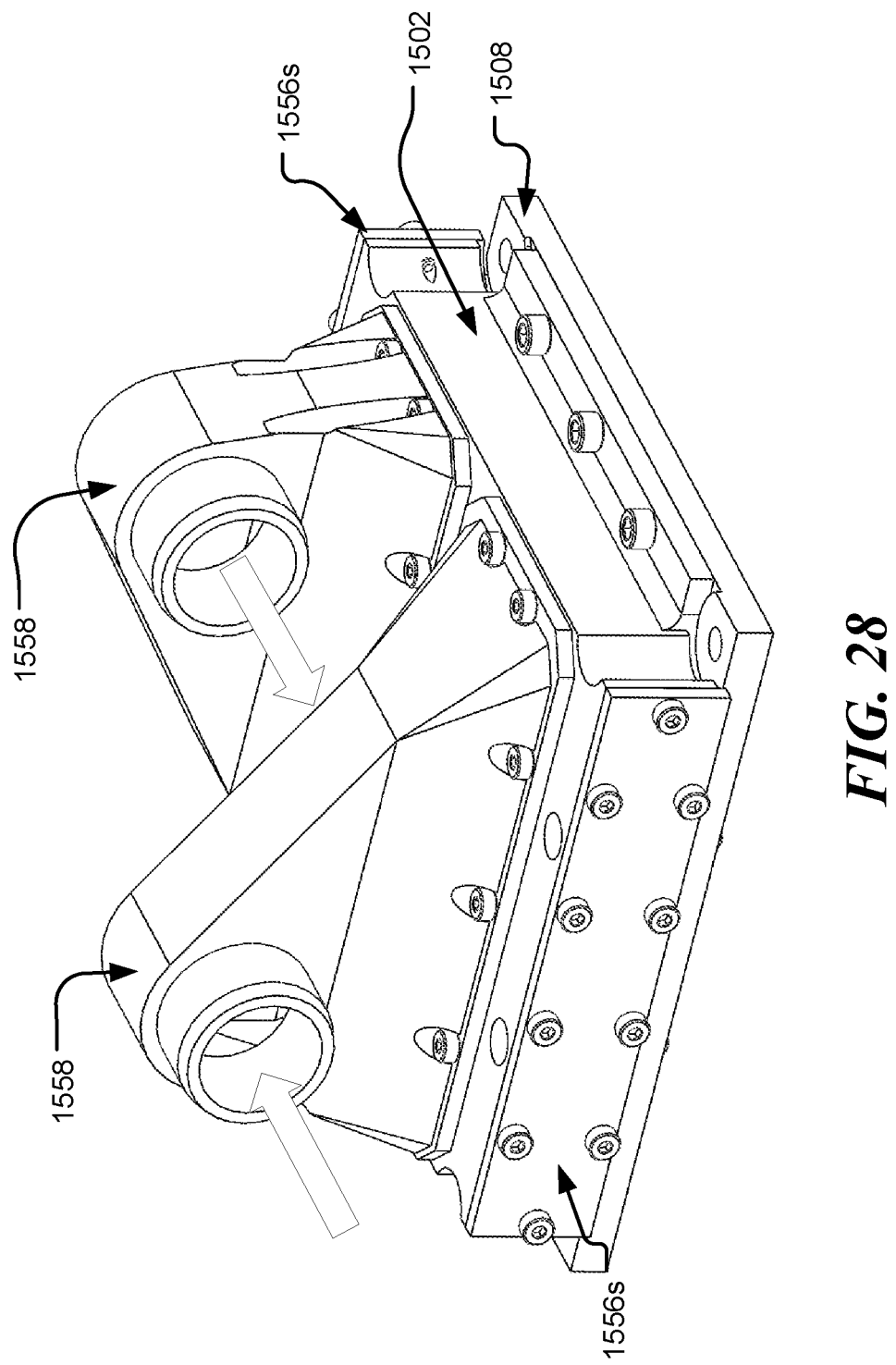
FIG. 28 is an isometric view of the manifold with an exemplary inflow and outflow configuration according to FIG. 27 with a pair of headers positioned atop the manifold, and a pair of blocking plates coupled to the front and back of the manifold.

FIG. 28 is an isometric view of the manifold 1502 with an exemplary inflow and outflow configuration according to FIG. 27 with a pair of headers 1558 positioned atop the manifold 1502, and a pair of side cover plates 1556s coupled to the front and back of the manifold 1502. In the figure, the manifold 1502 is unitarily constructed with a distributor plate, and the structure is mounted to an impingement target 1508. A fluid inflow arrow indicate the direction of fluid flow into an inflow header 1558 that directs fluid flow into and through the top inflow opening and into an internal inflow volume of the manifold 1502. And a fluid outflow arrow indicates the direction of fluid flow out of an outflow header 1558 that directs fluid flow out of the top outflow opening and out from an internal outflow volume of the manifold 1502. This is an exemplary embodiment illustrating one of the configurations of the manifold 1502. It is appreciated that other configurations may be utilized, such as those shown and described with reference to FIGS. 24-27, among others.

An exemplary embodiment of the impingement cooling device 1500 is as follows. An impingement cooling device 1500 for providing cooling fluid to an object may include a distributor plate 1506, a manifold 1502, and an impingement target 1508. The distributor plate 1506 includes a first side, a second side opposite the first side, a plurality of injection ports 1540 extending through the distributor plate from the first side to the second side, and a plurality of extraction ports 1542 extending through the distributor plate 1506 from the first side to the second side. The manifold 1502 coupled to the distributor plate 1506 and including an inflow volume, an outflow volume, a first inflow opening in fluid communication with the inflow volume and the plurality of injection ports 1540 of the distributor plate 1506, a first outflow opening in fluid communication with the outflow volume and the plurality of extraction ports 1542 of the distributor plate 1506, and at least one structure separating the inflow volume and the outflow volume on the first side of the distributor plate 1506. The impingement target 1508 includes a top surface, a bottom surface opposite the top surface, and a plurality of surface features protruding from the top surface. The impingement target 1508 is coupled to the distributor plate 1506 such that the second side of the distributor plate 1506 opposes the top surface of the impingement target 1508. And the impingement target 1508 is configured to be coupled to a heat spreader covering the object (e.g., integrated circuit) so as to provide cooling to the object.

An exemplary method of providing cooling fluid to an object covered by a heat spreader using the impingement cooling device 1500 may be as follows. The method may include coupling a bottom surface of an impingement target 1508 of the impingement cooling device 1500 to the heat spreader. The impingement cooling device 1500 comprising a distributor plate 1506, a manifold 1502, and the impingement target 1508. The distributor plate 1506 includes a first side, a second side opposite the first side, a plurality of injection ports 1540 extending through the distributor plate

1506 from the first side to the second side, and a plurality of extraction ports 1542 extending through the distributor plate 1506 from the first side to the second side. The manifold 1502 is coupled to the distributor plate 1506 and includes a first inflow opening in fluid communication with the plurality of injection ports 1540 of the distributor plate 1506, a first outflow opening in fluid communication with the plurality of extraction ports 1542 of the distributor plate 1506, and at least one structure providing a fluid barrier that separates the first inflow opening and the plurality of injection ports 1540 on the first side of the distributor plate 1506 from the first outflow opening and the plurality of extraction ports 1542 on the first side of the distributor plate 1506. The impingement target 1508 includes a top surface, the bottom surface opposite the top surface, and a plurality of surface features protruding from the top surface. The impingement target 1508 coupled to the distributor plate 1506 such that the second side of the distributor plate 1506 opposes the top surface of the impingement target 1508. The method further includes providing a first flow of fluid through the first inflow opening of the manifold 1502. The first flow of fluid providing cooling to the heat spreader covering the object.

It is believed the exemplary embodiments and the associated advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure. Any features or elements from any of the various embodiments may be modified, changed, added, or removed without departing from the teachings of the present disclosure. And features or elements from any embodiment may be incorporated to a different embodiment without limitation.

What is claimed is:

1. An impingement cooling device for providing cooling fluid to an object, the impingement cooling device comprising:
   a distributor plate including a first side, a second side opposite the first side, a plurality of injection ports extending through the distributor plate from the first side to the second side, and a plurality of extraction ports extending through the distributor plate from the first side to the second side;
   a manifold coupled to the distributor plate and including an inflow volume, an outflow volume, a first inflow opening in fluid communication with the inflow volume and the plurality of injection ports of the distributor plate, a first outflow opening in fluid communication with the outflow volume and the plurality of extraction ports of the distributor plate, and at least one structure separating the inflow volume and the outflow volume on the first side of the distributor plate; and
   an impingement target being a separate component from the distributor plate and including a top surface, a bottom surface opposite the top surface, and a plurality of surface features protruding from the top surface, impingement target configured to be coupled to the distributor plate such that the second side of the distributor plate opposes the top surface of the impingement target, wherein the impingement target is configured to be coupled to a heat spreader covering the object via a thermal interface material, wherein the bottom surface of the impingement target has a surface area larger than a top surface of the heat spreader such that the impingement target overhangs at least one side of the heat spreader, so as to provide cooling to the object.

2. The impingement cooling device of claim 1, wherein the thermal interface material is on the bottom side of the impingement target for facilitating heat transfer between the impingement target and the heat spreader.

3. The impingement cooling device of claim 1, wherein the plurality of surface features on the top surface of the impingement target comprise surface etchings or machined features.

4. The impingement cooling device of claim 1, wherein the plurality of surface features are offset from the plurality of injection ports and the plurality of extraction ports on the second side of the distributor plate when the top surface of the impingement target opposes the second side of the distributor plate.

5. The impingement cooling device of claim 1, wherein each of the plurality of injection ports are formed within a post that protrudes from the second side of the distributor plate.

6. The impingement cooling device of claim 5, wherein, when the impingement target is coupled to the distributor plate, the posts of the distributor plate and the surface features protruding from the top surface of the impingement target intersect a plane between the impingement target and the distributor plate.

7. The impingement cooling device of claim 6, wherein the plane is parallel to the top surface of the impingement target.

8. The impingement cooling device of claim 1, wherein the manifold comprises a second inflow opening in fluid communication with the inflow volume and the plurality of injection ports of the distributor plate, and a second outflow opening in fluid communication with the outflow volume and the plurality of extraction ports of the distributor plate.

9. The impingement cooling device of claim 8, further comprising one or more cover plates configured to be secured to the manifold to restrict fluid flow through at least one of the first inflow opening, the second inflow opening, the first outflow opening, and the second outflow opening.

10. The impingement cooling device of claim 1, wherein the at least one structure of the manifold includes planar wall sections defining a trapezoidal cross-section.

11. The impingement cooling device of claim 1, further comprising a thermal interface material bonding the manifold and the distributor plate together.

12. The impingement cooling device of claim 1, wherein the plurality of injection ports are non-linear nozzles.

* * * * *